US012288152B2

(12) United States Patent
Coenen

(10) Patent No.: US 12,288,152 B2
(45) Date of Patent: Apr. 29, 2025

(54) NEURAL NETWORK WEIGHT ENCODING

(71) Applicant: SEMICONDUCTOR COMPONENTS INDUSTRIES, LLC, Phoenix, AZ (US)

(72) Inventor: Ivo Leonardus Coenen, Coffrane (CH)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 520 days.

(21) Appl. No.: 16/816,453

(22) Filed: Mar. 12, 2020

(65) Prior Publication Data

US 2021/0287074 A1 Sep. 16, 2021

(51) Int. Cl.
*G06N 3/063* (2023.01)
*G06N 3/082* (2023.01)
*G11C 11/4063* (2006.01)

(52) U.S. Cl.
CPC ............ *G06N 3/063* (2013.01); *G06N 3/082* (2013.01); *G11C 11/4063* (2013.01)

(58) Field of Classification Search
CPC ..... G06N 3/063; G06N 3/082; G11C 11/4063
See application file for complete search history.

(56) References Cited

U.S. PATENT DOCUMENTS

| | | | | |
|---|---|---|---|---|
| 10,817,260 B1* | 10/2020 | Huang | ..................... | G06F 7/523 |
| 10,872,295 B1* | 12/2020 | Liu | ......................... | G06N 3/063 |
| 11,210,586 B1* | 12/2021 | Duong | ................... | G06N 3/063 |
| 2015/0199963 A1 | 7/2015 | Maaninen | | |
| 2016/0379109 A1 | 12/2016 | Chung et al. | | |
| 2018/0164866 A1 | 6/2018 | Turakhia et al. | | |
| 2019/0115933 A1* | 4/2019 | Chen | ........................ | G06N 3/04 |
| 2021/0157549 A1* | 5/2021 | Elmer | ................. | G06F 15/8046 |
| 2021/0182077 A1* | 6/2021 | Chen | ..................... | G06V 10/82 |

FOREIGN PATENT DOCUMENTS

| | | | |
|---|---|---|---|
| CN | 105488565 A | 4/2016 |
| CN | 106529670 A | 3/2017 |
| CN | 110070178 A | 7/2019 |

(Continued)

OTHER PUBLICATIONS

Han et al. ("A low-power deep neural network online learning processor for real-time object tracking application." IEEE Transactions on Circuits and Systems-I: Regular Papers, vol. 66, No. 5, May 2019 (Year: 2019).*

(Continued)

*Primary Examiner* — Mohamed Abou El Seoud
*Assistant Examiner* — Moriam Mosunmola Godo
(74) *Attorney, Agent, or Firm* — Brake Hughes Bellermann LLP

(57) ABSTRACT

According to an aspect, a neural network circuit for decoding weights of a neural network includes a weight memory configured to store encoded weights for the neural network, where the encoded weights includes an index weight word, and a decompression logic circuit configured to retrieve the encoded weights from the weight memory, decode the encoded weights using the index weight word to obtain a sequence of one or more non-pruned weight words and one or more pruned weight words, and provide the sequence of the non-pruned weight words and the pruned weight words to a plurality of input-weight multipliers.

18 Claims, 10 Drawing Sheets

(56) References Cited

FOREIGN PATENT DOCUMENTS

| CN | 110110851 A   | 8/2019  |
|----|---------------|---------|
| IN | 104915322 A   | 9/2015  |
| WO | 2017124644 A1 | 7/2017  |
| WO | 2017129325 A1 | 8/2017  |
| WO | 2017214728 A1 | 12/2017 |

OTHER PUBLICATIONS

Roohi et al. ("Processing-in-memory acceleration of convolutional neural networks for energy-effciency, and power-intermittency resilience." 20th International Symposium on Quality Electronic Design (ISQED). IEEE, 2019 (Year: 2019).*

DPRed: Making typical activation and weight values matter in deep learning computing. arXiv: 1804.06732v3 [cs.NE] Dec. 17, 2018 (Year: 2018).*

Taiwanese Office Action mailed on Nov. 13, 2024 for Taiwanese Application No. 110107456, 8 pages w/full English translation.

* cited by examiner

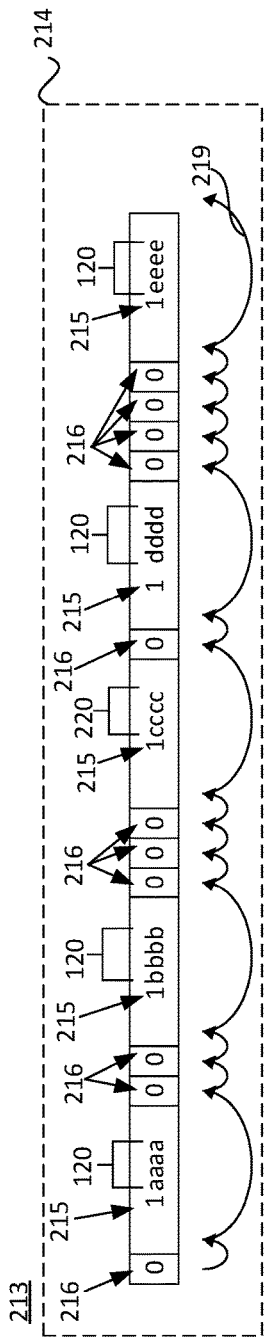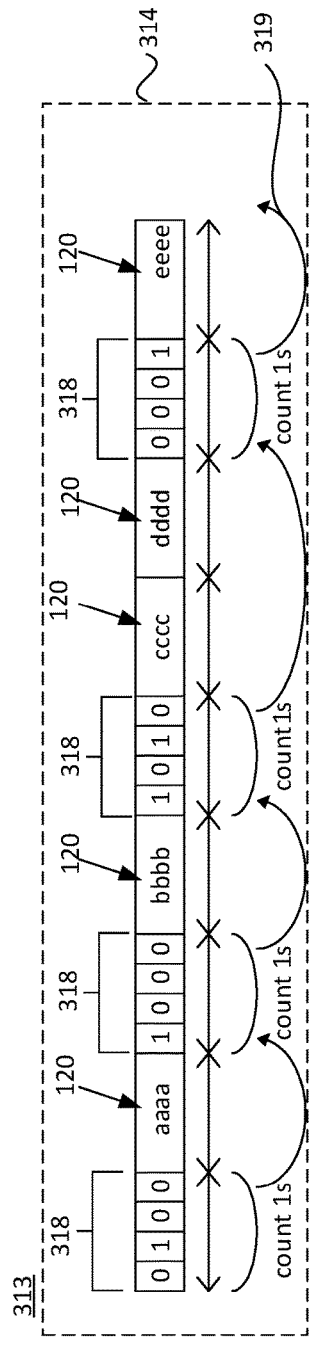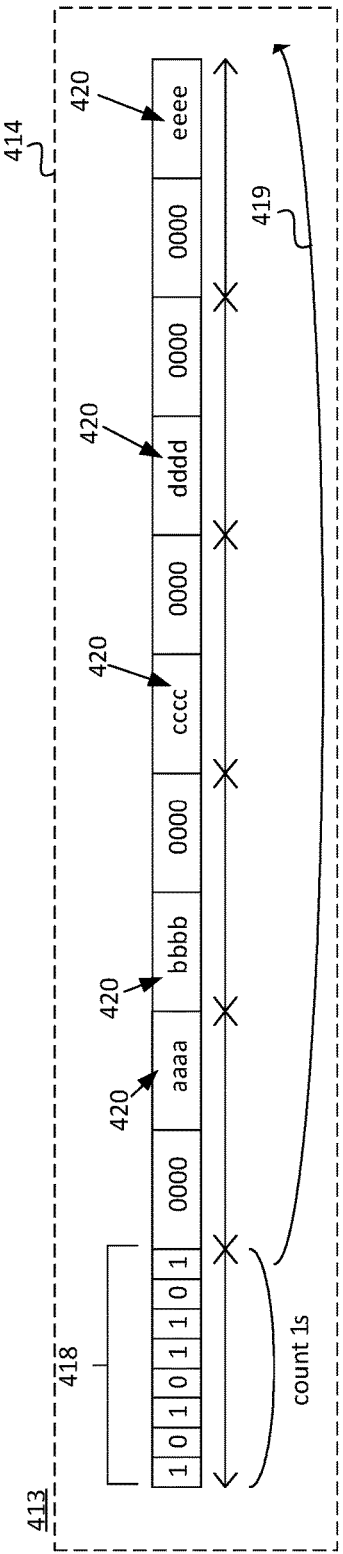

NEURAL NETWORK WEIGHT ENCODING

FIELD OF THE DISCLOSURE

The present disclosure relates to neural network weight encoding.

BACKGROUND

Neural networks may be used for signal processing. A neural network includes a number of layers, where each layer has a number of neurons. Between each layer, the neurons are associated with weight factors. Since the number of weights is the product of the number of neurons in both layers, the amount of weights can be relatively large (thereby increasing the amount of memory to store these weights) and the amount of multiplications can be relatively large (thereby increasing the amount of processing power to perform the multiplications).

SUMMARY

According to an aspect, a neural network circuit for decoding weights of a neural network includes a weight memory configured to store encoded weights for the neural network, where the encoded weights includes an index weight word, and a decompression logic circuit configured to retrieve the encoded weights from the weight memory, decode the encoded weights using the index weight word to obtain a sequence of one or more non-pruned weight words and one or more pruned weight words, and provide the sequence of the non-pruned weight words and the pruned weight words to a plurality of input-weight multipliers. In some examples, the pruned weight words include zero-value weight words, and the non-pruned weight words include non-zero-value weight words.

According to an aspect, the neural network circuit may include one or more of the following features (or any combination thereof). The index weight word includes a plurality of bits, where each bit has a first bit value or a second bit value, the first bit value indicates a pruned weight word in the sequence, and the second bit value indicates a non-pruned weight word in the sequence. The decompression logic circuit is configured to decode the encoded weights within a single clock cycle. The decompression logic circuit includes a weight word decoder, where the weight word decoder includes a plurality of shifters, a plurality of digital logic gates coupled to the plurality of shifters, and an index word decoder coupled to the plurality of shifters and the plurality of digital logic gates. The index word decoder is configured to control the plurality of shifters and the plurality of digital logic gates based on the index weight word. The plurality of shifters are connected in parallel to the index word decoder. Each of the plurality of shifters is configured to receive the non-pruned weight words and a control signal from the index word decoder that controls a shift operation applied to the non-pruned weight words. Each of the digital logic gates is configured to receive a control signal from the index word decoder that controls a Boolean operation executed by a respective digital logic gate. The plurality of digital logic gates include a first digital logic gate coupled to an output of a first shifter of the plurality of shifter, and a second digital logic gate coupled to an output of a second shifter of the plurality of shifters. The decompression logic circuit includes a first weight decoder configured to decode a first portion of the encoded weights, a second weight decoder configured to decode a second portion of the encoded weights, and a control logic circuit configured to control the first weight decoder and the second weight decoder. The first weight decoder is configured to receive a signal, from the control logic circuit, indicating a number of available weight words stored in a weight word buffer, and the first weight decoder is configured to determine a number of bits having a first bit value in the index weight word, and decode the first portion of the encoded weights in response to the number of available weight words stored in the weight word buffer being equal to or greater than the number of bits having the first bit value.

According to an aspect, a device includes a neural network configured to receive a set of inputs and generate a set of outputs, where the set of inputs include speech data, and the set of outputs include one or more potential speech commands that correspond to the speech data, a weight memory configured to store encoded weights for the neural network, and an accelerator configured to execute the neural network. The accelerator includes a decompression logic circuit configured to retrieve the encoded weights from the weight memory, and decode the encoded weights to obtain a sequence of one or more pruned weight words and one or more non-pruned weight words, where the pruned weight words include zero-value weight words, and the non-pruned weight words include non-zero-value weight words. The accelerator includes a plurality of input-weight multipliers configured to receive the sequence of the pruned weight words and the non-pruned weight words.

According to an aspect, the neural network circuit may include one or more of the above/below features (or any combination thereof). The decompression logic circuit includes a weight word buffer configured to temporarily store the encoded weights, where the encoded weights includes a first index weight word and a second index weight word, a first weight decoder configured to receive the encoded weights from the weight word buffer and generate a first group of decoded weight words using the first index weight word, and a second weight decoder configured to receive a portion of the encoded weights from the first weight decoder and generate a second group of decoded weight words using the second index weight word. The device includes a control logic configured to control the first weight decoder and the second weight decoder, a shifter configured to receive the first group of decoded weight words from the first weight decoder and the second group of decoded weight words from the second weight decoder, and a plurality of weight registers coupled to the shifter, where each weight register of the plurality of weight registers is configured to receive a separate decoded weight word from the shifter. The encoded weights include an index weight word and one or more non-pruned weight words, and the decompression logic circuit includes a weight word decoder. The weight word decoder includes a plurality of shifters, a plurality of AND gates coupled to the plurality of shifters, and an index word decoder coupled to the plurality of shifters and the plurality of AND gates, where the index word decoder is configured to control the plurality of shifters and the plurality of AND gates based on bit values of individual bits of the index weight word. Each of the plurality of shifters is configured to receive the non-pruned weight words and a first control signal from the index word decoder, where each shifter is configured to execute a shift operation on the non-pruned weight words according to the first control signal. Each of the AND gates is configured to an output of a respective shifter and a second control signal from the index word decoder, where each AND gate is configured to execute an AND operation on the output of a respective shifter and the second control signal. The encoded weights include an index weight word followed by the non-pruned weight words, where the encoded weights do not include weight values for the pruned weight words. The index weight word includes a plurality of bits, where each bit has a first bit value or a second bit value. The first bit value indicates a pruned weight word in the sequence. The second bit value indicates a non-pruned weight word in the sequence. The pruned weight word is one of a most significant byte or a least significant byte of a respective encoded weight.

According to an aspect, a method of decoding weights of a neural network includes retrieving encoded weights from a weight memory via a processor data bus, where the encoded weights include an index weight word, decoding the encoded weights using the index weight word to obtain a sequence of one or more pruned weight words and one or more non-pruned weight words, where the pruned weight words include zero-value weight words and the non-pruned weight words include non-zero-value weight words, and providing the sequence of the non-pruned weight words and the pruned weight words to a plurality of input-weight multipliers.

In some aspects, the index weight word includes a plurality of bits, where each bit has a first bit value or a second bit value. The first bit value indicates a pruned weight word in the sequence, and the second bit value indicates a non-pruned weight word in the sequence. The pruned weight word is decoded to zero in response to a bit within the index weight word having the first bit value. The decoding may include controlling a plurality of shifters and a plurality of digital logic gates based on the index weight word.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

FIG. 2 illustrates an encoding scheme for encoding the weights of the neural network according to an aspect.

FIG. 3 illustrates an encoding scheme for encoding the weights of the neural network according to another aspect.

FIG. 4 illustrates an encoding scheme for encoding the weights of the neural network according to another aspect.

The components in the drawings are not necessarily to scale relative to each other. Like reference numerals designate corresponding parts throughout the several views.

DETAILED DESCRIPTION

Figure 1A:
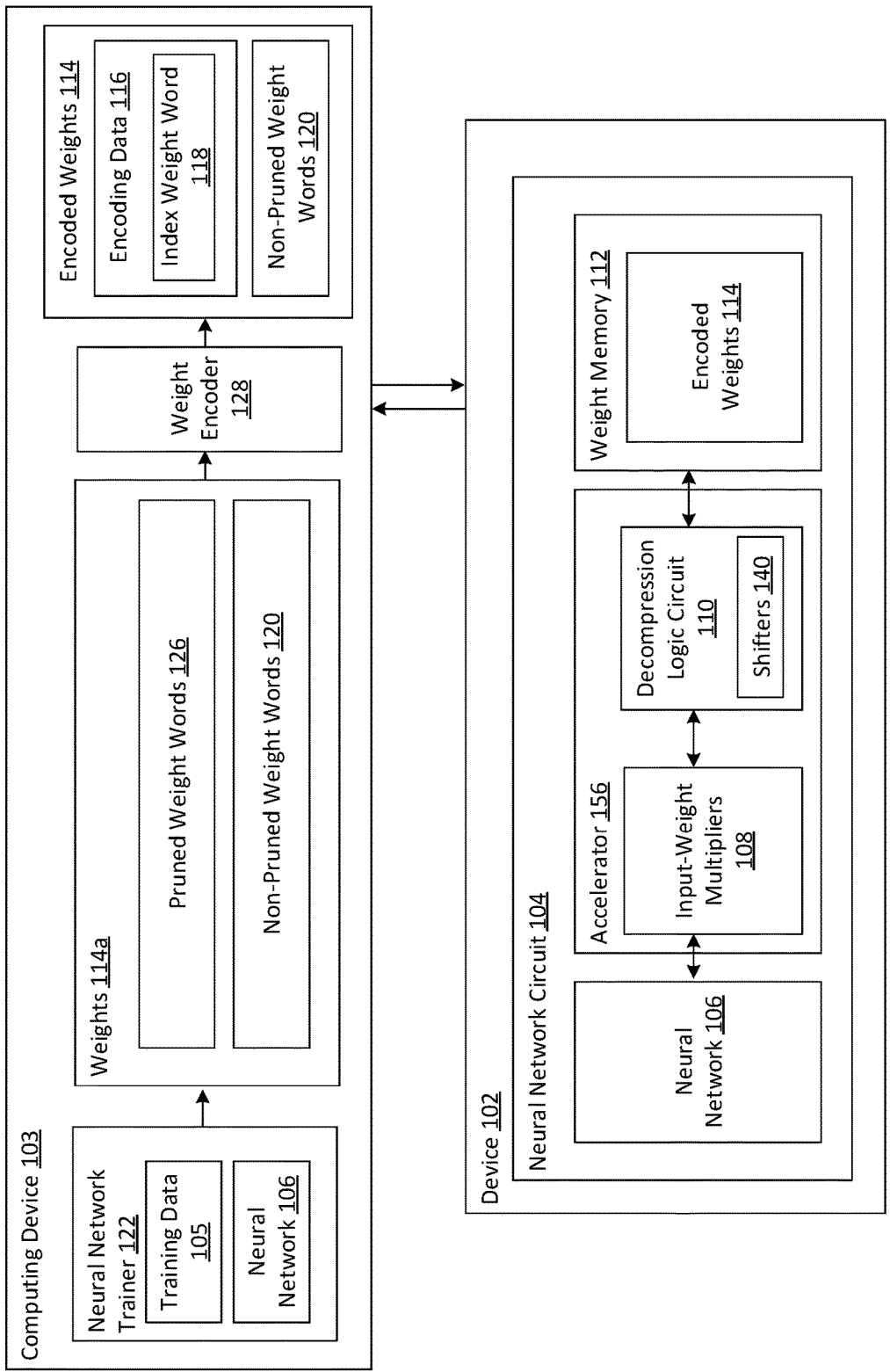
FIG. 1A illustrates a neural network system for encoding and decoding weights for a neural network according to an aspect.

FIGS. 1A through 1D illustrate a neural network system 100 for encoding and/or decoding weights of a neural network 106 that increases the speed of execution while reducing the memory requirements of the neural network system 100. For example, referring to FIGS. 1B and 1C, the neural network 106 includes multiple layers 129 of neurons 131 that are connected with synapses 138 (also referred to as weight factors or weights). Because the number of weights is the product of the number of neurons 131 in adjacent layers 129, in some examples, the amount of weights may be relatively large, and, as a result, may require an a relatively large memory device to store the weights. For example, a neural network 106 with more than one hundred thousand weights may require one hundred kilobytes (kB) of memory (assuming 8-bit weights), which is relatively large for devices with a relatively small memory capacity.

In addition, the amount of multiplications to be executed may be relatively large, which may cause the speed of execution to be relatively slow and/or require an increased amount of processing power. For example, a neural network 106 may require a high number of cycles to obtain an output (e.g., over fifty thousand cycle, over one hundred thousand cycles), and the neural network 106 may be required to obtain multiple outputs in a given time frame (e.g., over fifty times per second, over one hundred times per second, etc.). An increase in cycle speed to accommodate the large number of required operations corresponds to an increase in power. Clock speeds for some applications, however, may be restrained to a low rate (e.g., less than 100 MHz, less than 50 MHz, less than 20 MHz) to conserve power.

Some of the weights may be pruned (or removed) to conserve memory. For example, when a first neuron value multiplied by a low weight value (e.g., a very low weight value) may have little impact on the accumulated sum even if the first neuron value is very high (e.g., even if the first neuron is highly active). In some examples, these low value weights may be pruned (e.g., removed) from the neural network 106 without significantly reducing the accuracy of the neural network 106 (if any). This pruning can save processing (e.g., multiplications, additions) and memory requirements. In some examples, a certain percentage (e.g., over 50%, over 70%, over 80%, or over 90%, etc.) of the weights can be pruned without a significant (e.g., any) loss of accuracy). However, the pruning (or removal) of low-value weights may cause the neural network 106 to be irregular (e.g., not fully connected).

However, according to the techniques discussed herein, the neural network system 100 provides an efficiency mechanism for storing encoded weights 114 and decoding the encoded weights 114 that may reduce the size of the memory required to store the encoded weights 114, reduce the complexity of the decoding logic, and/or increase the speed at which the encoded weights 114 are decoded, thereby enabling fast execution of the neural network 106 for devices consuming relatively low power.

For example, weights 114a (e.g., a sequence a weight words) are encoded according to an encoding scheme such that the encoded weights 114 do not include the actual values of pruned weight words 126 (e.g., the pruned weight words 126 are removed from the encoded weights 114), thereby reducing the amount of memory required to store the encoded weights 114. In other words, the pruned weight words 126 are pruned (or removed) from the encoded weights 114, but the encoded weights 114 includes encoding data 116 that represents the locations of the pruned weight words 126 within the sequence of weights. The neural network system 100 includes decoding logic that decodes the encoded weights 114 to obtain a sequence of the pruned weight words 126 and non-pruned weight words 120. For example, the decoding logic is configured to decode the pruned weight words 126 to zero and include them in the correct sequence among the non-pruned weight words 120. The sequence of the pruned weight words 126 and the non-pruned weight words 120 are provided to input-weight multipliers 108 to be multiplied with the input values.

In contrast to some conventional approaches that communicate a weight and its neuron offset to a tile that computes it, the decoding mechanism discussed herein computes the pruned weight words 126 (thereby no need for a neuron offset), which are decoded to zero (and consequently do not require additional toggling power in the input-weight multipliers 108). In some examples, the decoding mechanism is required to execute relatively fast, where the encoded weights 114 are decoded in a single clock cycle between fifteen MHz and eighty MHz, and the conventional approaches of communicating a weight and a neuron offset would not be sufficiently fast to decode the encoded weights 114. For example, the computation of the weight and neuron offset may be too slow for some applications. Also, in some conventional approaches, run length encoding (RLE) is used in a convolution neural network for weights that are stored or transmitted, and, in RLE, the weights are in a floating point format. For example, when one or multiple weights are zero, these weights are encoded in floating point numbers that are normally not used in the neural network (e.g., minus zero, subnormal, not-a-number, infinity) in which the unused bits are used to encode the amount of zero weights. However, in contrast to some conventional approaches, in some examples, the encoding/decoding mechanisms discussed herein do not use floating point numbers, but rather use integer arithmetic, and thus may result in smaller logic and lower power. With that said, floating point numbers (e.g., small floating point numbers) may be used in neural networks as they may provide a larger dynamic range compared to the same number of bits in integer programming. In some examples, the weight pruning decompression mechanism discussed herein may be used in combination with floating point weights.

In some examples, the neural network system 100 implements a hardware decoding of pruned weight words 126 using an index weight word 118 for each set of weight words. In some examples, the number of weight words (e.g., a combination of pruned words 126 and non-pruned weight words 120) is equal to the number of bits in the index weight word 118. In some examples, the neural network system 100 uses a hardware implementation that uses shifters 140 that result in faster logic timing allowing to decode multiple index weight words 118 in a single clock cycle.

Referring to FIG. 1A, the neural network system 100 included a computing device 103 and a device 102. The computing device 103 may be one or more computers that train the neural network 106 to generate weights 114a and encode the weights 114a to generate the encoded weights 114. Then, the encoded weights 114 may be stored in a weight memory 112 of the device 102. During execution of the neural network 106, the device 102 may obtain the encoded weights 114 from the weight memory 112, decode the encoded weights 114, and execute the neural network 106 using the decoded weights and input data captured by the device 102 to compute the output of the neural network 106. The output of the neural network 106 may depend on the type of application utilized by the device 102, and the output of the neural network 106 may trigger other function(s) of the device 102.

In some examples, the computing device 103 includes one or more computers that are separate from the device 102. In some examples, the computing device 103 includes one or more server computers. In some examples, the device 102 is communicatively coupled to the computing device 103 (e.g., wired or wireless connection) such that the device 102 can receive and then store the encoded weights 114. In some examples, the device 102 is communicatively coupled to the computing device 103 during the production of the device 102 (in order to store the encoded weights 114 on the device 102) but is not communicatively coupled to the computing device 103 while the device 102 is placed in its field of use. In some examples, the device 102 is communicatively coupled to the computing device 103 (while the device 102 is in its field of use) in order to receive, over a network, re-trained (re-encoded) weights 114 from the computing device 103. In some examples, the device 102 is communicatively coupled to the computing device 103 via a network-based connection such as an internet connection (e.g., a Wi-Fi connection, a mobile network interface connection) or private wide area network (WAN) connection. In some examples, the computing device 103 generates the encoded weights 114 during manufacturing (e.g., production of the device 102), and then stores the encoded weights 114 in the weight memory 112 of the device 102, which is then placed in its field of use. In some examples, the device 102 is connected to the computing device 103 via a wireless connection, and the device 102 can receive (e.g., periodically receive) updated weights 114 (e.g., re-trained/re-encoded weights) during portions of the device's lifetime.

In some examples, the device 102 includes digital circuitry that is smaller in terms of processing power and memory size than the computing device 103. In some examples, the computing device 103 may be one or more high-powered computers that are configured to train the neural network 106 to generate the weights 114a and then encode the weights 114a to generate the encoded weights 114, and the device 102 may be considered a low-powered (relatively small) device that executes the neural network 106 with the encoded weights 114 determined by the computing device 103.

The device 102 may be any type of device that can execute a neural network 106 using encoded weights 114. The device 102 includes a neural network circuit 104, where the neural network circuit 104 includes a weight memory 112 that stores the encoded weights 114, a neural network 106, and an accelerator 156 configured to assist with the execution of the neural network 106. In some examples, the weight memory 112 includes random-access memory (RAM). In some examples, the neural network circuit 104 is a system on chip (SOC) device (e.g., an integrated circuit coupled to a semiconductor substrate). In some examples, by using the encoding schemes discussed herein, the weight memory 112 may be relatively small since pruned weight words 126 are not included within the encoded weights 114. In some examples, the neural network 106 is considered as part of the accelerator 156.

The accelerator 156 may include a decompression logic circuit 110 and input-weight multipliers 108. In some examples, the decompression logic circuit 110 includes one or more hardware decoding components that enable relatively fast decoding of the encoded weights 114. In some examples, the decompression logic circuit 110 includes a hardware implementation that uses shifters 140 that result in faster logic timing allowing to decode multiple weight words at the same time. The decompression logic circuit 110 may retrieve the encoded weights 114 from the weight memory 112 (via a data bus), decode the encoded weights 114, and provide the decoded weights to the input-weight multipliers 108 to perform the appropriate multiplications. The input-weight multipliers 108 may be considered the part of the accelerator 156 that multiply the inputs and corresponding weights of the synapses 138 that connect two layers 129 of the neural network 106. In some examples, the input-weight multipliers 108 are considered part of one or more multiplication and accumulation units (e.g., MAC units).

In some examples, the device 102 is a speech recognition device. In some examples, the device 102 is a hearing aid device. The neural network circuit 104 is configured to receive an audio input and determine an audio speech command based on the audio input. In some examples, the device 102 utilizes the neural network 106 to improve recognition of commands spoken by a user. Based on a recognized command (e.g., volume up), the device 102 may perform a function (e.g., increase volume). Additionally, or alternatively, the device 102 may utilize the neural network 106 to improve recognition of a background environment. Based on a recognized environment, the device 102 may (automatically) perform a function (e.g., change a noise cancellation setting). The use of the accelerator 156 may decrease a power consumption required for computing the neural network 106, which may be required frequently for speech recognition scenarios described. The reduced power may be advantageous for relatively small devices with relatively low power consumption (e.g., hearing aids).

In some examples, the device 102 using the neural network 106 and the accelerator 156 may improve speech recognition (e.g., voice commands) or sound recognition (e.g., background noise types) in a power efficient way (e.g., to conserve battery life). In some examples, the accelerator 156 is a semiconductor (i.e., hardware) platform (i.e., block) that aids a processor in implementing the neural network 106. The accelerator 156 includes hard coded logic and mathematical functions that can be controlled (e.g., by a state machine configured by a processor) to process the neural network 106. In some examples, the accelerator 156 can process the neural network 106 faster and more (power) efficiently than conventional software running on, for example, a digital signal processor (DSP). A DSP approach may require additional processing/power resources to fetch software instructions, perform computations in series, and perform computations using a bit depth that is much higher than may be desirable for a particular application. Instead, in some examples, the accelerator 156 avoids fetching of software instructions, performs processing (e.g., computations) in parallel, and processes using a bit depth for a neural network 106 suitable for a particular application.

Neural networks 106 (e.g., deep neural networks) may require a very large number of operations (e.g., between ten and one hundred thousand or greater than one hundred thousand) to reach a conclusion. Further, a neural network 106 may require reaching many computations per second in order to respond to a stream of input data. In some examples, the neural network 106 may require more than two hundred thousand to obtain an output and an output must be obtained every ten milliseconds, which may require a relatively large amount of power. Further, these requirements could result in clock speeds of around twenty megahertz, which may be too high for a typical low power DSP for some applications. Some of the techniques discussed herein may implement the neural network 106 in applications with the same (or similar) requirements, enabling these applications to be small in size and low power. For example, the accelerator 156 may reduce power consumption by processing multiple neurons 131 at the same time while keeping the input data at the input-weight multipliers 108 stable for multiple cycles. Holding the input data stable decreases the amount of toggling at the inputs of the multipliers. As a result, less power may be consumed (i.e., less than if they were not held stable). The accelerator 156 may also reduce power consumption by performing multiple multiplications in parallel (e.g., execution of the input-weight multipliers 108 may be performed at least partially in parallel). This parallelism reduces the amount of clocking necessary for the accumulators. As a result, less power is consumed (i.e., less than without the added parallelism).

The computing device 103 includes a neural network trainer 122 configured to train the neural network 106 using training data 105, where the results of the training determines the weights 114a. A weight 114a may represent the strength of the connection between units. If the weight 114a from neuron A to neuron B has a greater magnitude, it means that neuron A has greater influence over neuron B. The weights 114a includes a sequence of weight words, where each weight word has a particular size (e.g., four-bit, eight-bit, sixteen-bit, etc. weight words). The training of the neural network 106 may be updated based on heuristic data collected during an implementation. The training results in a set of weights 114a for synapses and biases for a final neuron accumulation. During the training, a weight 114a having a relatively low value is set to zero. As such, the neural network trainer 122 may generate weights 114a that include pruned weight words 126 and non-pruned weight words 120. A particular pruned weight word 126 or a particular non-pruned weight word 120 is the value of the weight associated with a single synapse 138. The pruned weight words 126 may be referred to as weight words that are set to zero and removed from the encoded weights 114. In some examples, the pruned weight words 126 are zero-value weight words (e.g., "0000" if the weight word is four bits). The non-pruned weight words 120 may be referred to as weight words that are not pruned (e.g., not removed from the encoded weights). In some examples, non-pruned weight words 120 include non-zero-value weight words (e.g., "AAAA" if the weight word is four bits). In some examples, according to the encoding scheme used, the non-pruned weight words 120 may include one or more zero-value weight words.

In some examples, a majority of the weights 114a includes pruned weight words 126. The computing device 103 includes a weight encoder 128 that encodes the weights 114a to generate the encoded weights 114. The encoded weights 114 include encoding data 116 and the non-pruned weight words 120. The encoded weights 114 may not include the values of the pruned weight words 126 (thereby being pruned or removed) from the encoded weights 114.

The encoding data 116 may include digital data that indicates an existence of one or more pruned weight words 126 within the sequence of the non-pruned weight words 120. In some examples, the encoding data 116 includes an index weight word 118. In some examples, the index weight word 118 may be considered a header, which is followed by one or more non-pruned weight words 120 (or none). In some examples, the index eight word 118 is a single bit having a first bit value (e.g., "0") or a second bit value (e.g., "1"). In some examples, the index weight word 118 includes multiple bits. In some examples, the index weight word 118 is a four-bit index word. In some examples, the index weight word 118 is an eight-bit index word. In some examples, the index weight word 118 is a sixteen-bit index word. In some examples, the index weight word 118 is a thirty-two bit index word.

In some examples, sixteen-bit weights are encoded by the weight encoder 128 using eight-bit weight words. However, the number of bits for the weight words may encompass any value, and the number of bits for the weights may encompass any value. In some examples, the most significant byte (MSB) (or the most significant part) is pruned and the least significant byte (LSB) (or the least significant part) is non-pruned, then that least significant byte (LSB) (or the least significant part) is sign extended to create a signed sixteen-bit value (or any bit value that is used for the encoding). For example, when the pruned weight word is the most significant part, a sign of the least significant part is used to fill the most significant part. In some examples, the index weight word 118 may be an eight-bit index word. For each sixteen-bit weight, the weight encoder 128 is configured to identify the most significance byte (MSB) of the sixteen-bit weight as a pruned weight word 126 and the least significant byte (LSB) as a non-pruned weight word 120, and the least significant byte (LSB) is signed extended. In some examples, the weight encoded 128 is configured to identify the least significant byte (LSB) of the sixteen-bit weight as a pruned weight word 126 and the most significant byte (MSB) as a non-pruned weight word 120, and the least significant byte (LSB) is zero in this case.

Figure 1B:
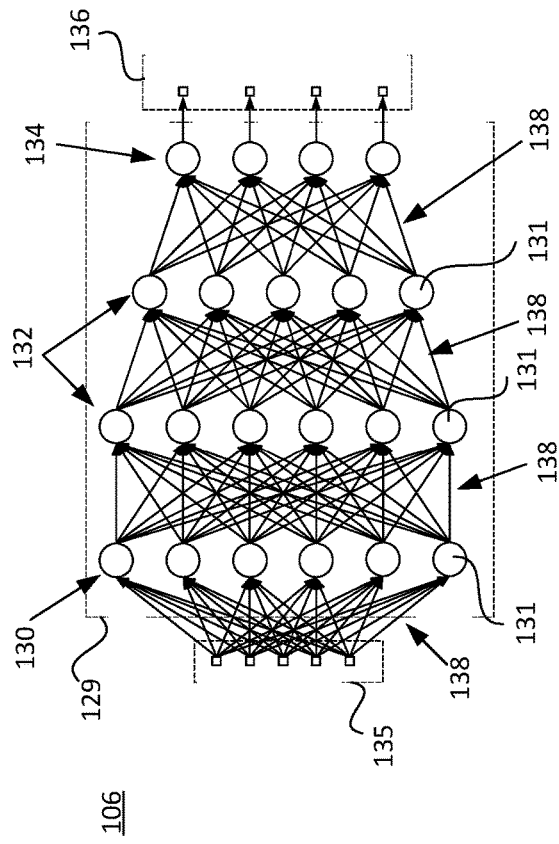
FIG. 1B illustrates a fully-connected neural network according to an aspect.

FIG. 1B illustrates a neural network 106 that is fully connected according to an aspect. The neural network 106 includes a set of computational processes for receiving a set of inputs 135 (e.g., input values) and generating a set of outputs 136 (e.g., output values). In some examples, each output value of the set of outputs 136 may represent a speech command and the input values may represent speech (e.g., audio data in the frequency domain). The neural network 106 includes a plurality of layers 129, where each layer 129 includes a plurality of neurons 131. The plurality of layers 129 may include an input layer 130, one or more hidden layers 132, and an output layer 134. In some examples, each output of the output layer 134 represents a possible recognition (e.g., machine recognition of speech commands or image identification). In some examples, the output of the output layer 134 with the highest value represents the recognition that is most likely to correspond to the input.

In some examples, the neural network 106 is a deep neural network (DNN). For example, a deep neural network (DNN) may have one or more hidden layers 132 disposed between the input layer 130 and the output layer 134. However, the neural network 106 may be any type of artificial neural network (ANN) including a convolution neural network (CNN). The neurons 131 in one layer 129 are connected to the neurons 131 in another layer via synapses 138. For example, each arrow in FIG. 1B may represent a separate synapse 138. Fully connected layers 129 (such as shown in FIG. 1B) connect every neuron 131 in one layer 129 to every neuron in the adjacent layer 129 via the synapses 138.

Each synapse 138 is associated with a weight 114a. A weight 114a is a parameter within the neural network 106 that transforms input data within the hidden layers 132. As an input enters the neuron 131, the input is multiplied by a weight value (e.g., a weight word) and the resulting output is either observed or passed to the next layer in the neural network 106. For example, each neuron 131 has a value corresponding to the neuron's activity (e.g., activation value). The activation value can be, for example, a value between 0 and 1 or a value between −1 and +1. The value for each neuron 131 is determined by the collection of synapses 138 that couple each neuron 131 to other neurons 131 in a previous layer 129. The value for a given neuron 131 is related to an accumulated, weighted sum of all neurons 131 in a previous layer 129. In other words, the value of each neuron 131 in a first layer 129 is multiplied by a corresponding weight and these values are summed together to compute the activation value of a neuron 131 in a second layer 129. Additionally, a bias may be added to the sum to adjust an overall activity of a neuron 131. Further, the sum including the bias may be applied to an activation function, which maps the sum to a range (e.g., zero to 1). Possible activation functions may include (but are not limited to) rectified linear unit (ReLu), sigmoid, or hyperbolic tangent (TanH).

Figure 1C:
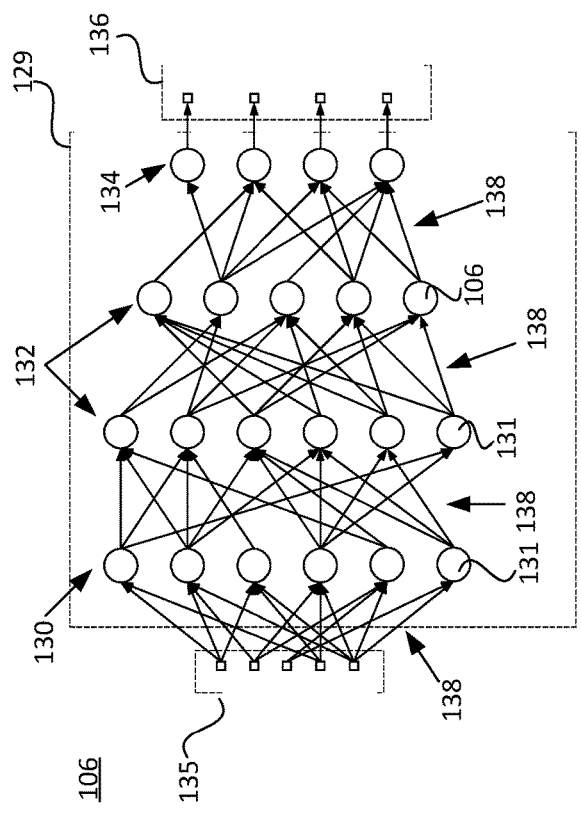
FIG. 1C illustrates a partially-connected neural network according to an aspect.

FIG. 1C illustrates a neural network 106 that is partially connected. For example, similar to FIG. 1B, the neural network 106 includes a set of computational processes for receiving a set of inputs 135 (e.g., input values) and generating a set of outputs 136 (e.g., output values). Also, the neural network 106 includes a plurality of layers 129, where each layer 129 includes a plurality of neurons 131, and the layers 129 include an input layer 130, one or more hidden layers 132, and an output layer 134. The neurons 131 in one layer 129 are connected to neurons 131 in an adjacent layer 129 via the synapses 138. However, unlike FIG. 1B, the neural network 106 is not fully connected, where every neuron 131 in one layer 129 is not connected to every neuron in the adjacent layer 129 via the synapses 138. For example, as indicated above. the weights 114a include pruned weight words 126 and non-pruned weight words 120. If a synapse 138 is associated with a pruned weight word 126, that synapse 138 (and consequently the corresponding weight) may be considered pruned or removed from the neural network 106, thereby producing a partially-connected (or irregular) neural network 106.

Figure 1D:
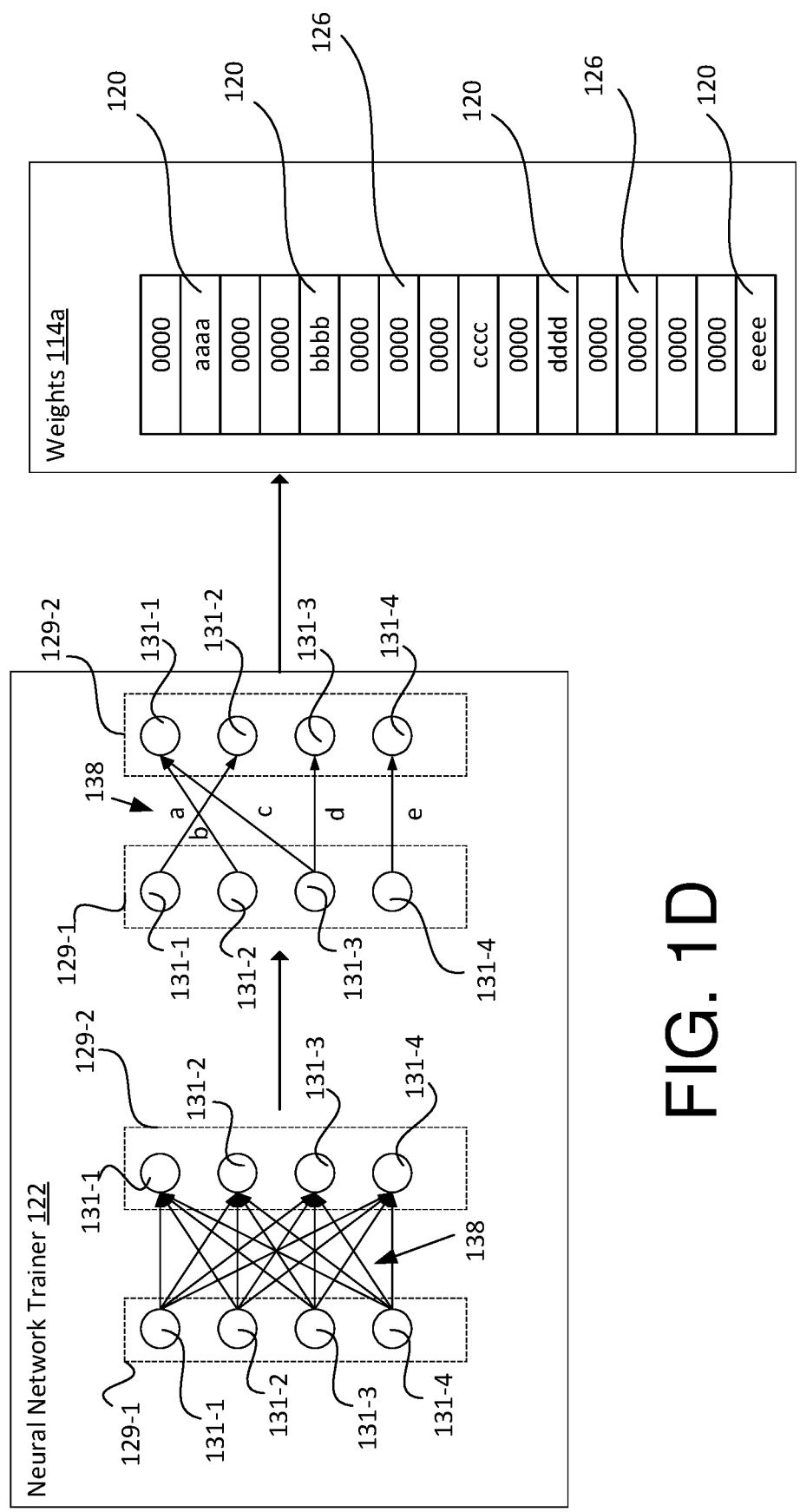
FIG. 1D illustrates a neural network trainer configured to prune synapses of the neural network and the weights of the pruned synapses are stored as zero-value weights according to an aspect.

FIG. 1D illustrates an example of the neural network trainer 122, which during the learning process (e.g., the determination of the weights 114a), may set weights 114a that are very small (and thus have little significance) to zero. For example, as shown in FIG. 1D, a portion of the neural network 106 includes a first layer 129-1 having four neurons 131 (e.g., a first neuron 131-1, a second neuron 131-2, a third neuron 131-3, and a fourth neuron 131-4), and a second layer 129-2 having four neurons 131 (e.g., a first neuron 131-1, a second neuron 131-2, a third neuron 131-3, and a fourth neuron 131-4). Before the pruning process, each neuron 131 in the second layer 129-2 is connected to every neuron 131 in the first layer 129-1 (e.g., the second layer 129-2 is a fully connected layer) via a synapse 138. However, if the weight 114a associated with a respective synapse 138 is below a threshold level, that weight 114a is set to zero, which results in a less complex neural network 106. As shown in FIG. 1D, after the pruning process, there are five synapses 138: a (having a weight word value of "aaaa"), b (having a weight word value of "bbbb"), c (having a weight word value of "cccc"), d (having a weight word value of "dddd", and e (having a weight word value of "eeee), which represent the non-pruned weight words 120. The remainder of the weights 114a are set to zero ("0000"), thereby representing the pruned weight words 126. For example, the neural network trainer 122 is configured to generate the weights 114a, which includes the pruned weight words 126 and the non-pruned weight words 120. Although FIG. 1D, depicts a weight word as four bits, each weight word may include any number of bits including an eight-bit weight word or sixteen-bit weight word, etc. If the weights 114a were stored in memory on the device 102, the size of the memory (e.g., the weight memory 112) may be quite large since it would have to store many pruned weight words 126.

FIGS. 2 through 4 illustrate different encoding mechanisms for the bit encoding of pruned weight words 126. For example, FIGS. 2 through 4 illustrate different encoding schemes that can be used by the weight encoder 128 to generate the encoded weights 114 such that the values of the pruned weight words 126 are not included in the encoded weights 114, thereby reducing the amount of memory (e.g., the weight memory 112) needed to store the encoded weights 114.

FIG. 2 illustrates an encoding scheme 213 for encoding the weights 114a of FIG. 1D to generate encoded weights 214 according to an aspect. The encoded weights 214 may be an example of the encoded weights 114 of FIGS. 1A through 1D and may include any of the details discussed herein with respect to those figures. As discussed above, the weights 114a of FIG. 1D may represent sixteen weight words, which includes the pruned weight words 126 and the non-pruned weight words 120. In this example, each weight word is four bits. The encoding scheme 213 uses single bit encoding for pruned weight words 126.

The sequence of encoded weights 214 do not include the values ("0000") of the pruned weight words 126. Rather, the encoded weights 214 include encoding data 216 that represents the existence of a pruned weight word 126 within the sequence of weight words. The encoding data 216 may be a single bit that represents a pruned weight word 126. In some examples, as shown in FIG. 2, a logic low value ("0") indicates the presence of a pruned weight word 126. In some examples, a logic high value ("1") indicates the presence of a pruned weight word 126.

Using the example of the weights 114a of FIG. 1D, according to the encoding scheme 213 of FIG. 2, the first weight word ("0000") is a pruned weight word 126, and therefore the first bit in the encoded weights 214 is the single bit having a value of zero (e.g., the encoding data 216). The next weight word ("aaaa") is a non-pruned weight word 120, and therefore the next bits in the encoded weights 214 is the value of this weight word ("aaaa"). In some examples, encoding data 215 (e.g., a single bit value of "1") is disposed in front of the non-pruned weight word 120 to indicate that what follows is a non-pruned weight word 120. The third and fourth weight words are pruned weight words 126, and therefore, the next bits in the encoded weights 214 include the recitation of two single bits with values of zero (e.g., the encoding data 216). The fifth weight word is a non-pruned weight word 120 ("bbbb"), and therefore the next bits in the encoded weights 214 is the value of this weight word ("bbbb"), which is preceded by the encoding data 215 (e.g., a single bit with the value of "1").

The sixth, seventh, and eighth weight words are pruned weight words 126, and therefore the next bits in the encoded weights 214 are three single bits with values of zero (e.g., the encoding data 216). The ninth weight word is a non-pruned weight word 120 ("cccc"), and therefore the next bits in the encoded weights 214 is the value of this weight word ("cccc"), which is preceded by the encoding data 215 (e.g., a single bit with the value of "1"). The tenth weight word is a pruned weight word 126, and therefore, the next bit in the encoded weights 214 include the recitation of a single bit with a value of zero (e.g., the encoding data 216). The eleventh weight word is a non-pruned weight word 120 ("dddd") and therefore the next bits in the encoded weights 214 is the value of this weight word ("dddd"), which is preceded by the encoding data 215 (e.g., a single bit with the value of "1"). The twelfth, thirteenth, fourteenth, and fifteenth weight words are pruned weight words 126, and therefore the next bits in the encoded weights 214 include the recitation of four single bits with values of zero (e.g., the encoding data 216). The sixteenth weight word is a non-pruned weight word 120 ("eeee"), and therefore the next bits in the encoded weights 214 is the value of this weight word ("eeee"), which is preceded by the encoding data 215 (e.g., a single bit with a value of "1").

For the encoding scheme 213 of FIG. 2, the decoding logic may be executed on a bit level. In FIG. 2, an arrow 219 represents the number of indexing shifts required to decode the encoded weights 214. In this example, the decompression logic circuit 110 may be required to implement sixteenth indexing shifts to decode the encoded weights 214. The details of the decoding performed by the decompression logic circuit 110 is further explained later in the disclosure.

FIG. 3 illustrates an encoding scheme 313 for encoding the weights 114a of FIG. 1D to generate encoded weights 314 according to an aspect. The encoded weights 314 may be an example of the encoded weights 114 of FIGS. 1A through 1D and may include any of the details discussed wherein with respect to those figures. As discussed above, the weights 114a of FIG. 1D may represent sixteen weight words, which includes the pruned weight words 126 and the non-pruned weight words 120. The encoded weights 314 are generated using an index weight word 318 followed by one or more non-pruned weight words 120 (or none). For example, the encoding scheme 313 uses an index weight word 318 followed by weight words with four-bit word boundaries (e.g., the four bit weight words are compressed using an eight bit compression scheme).

The number of bits in the index weight word 318 may be equal to the number of weight words in the set. For example, a particular four-bit index weight word 318 may represent four weight words. If two of the bits in the index weight word 318 has a logic value of "0" and two of the other bits in the index weight word 318 has a logic value of "1", the sequence would include two pruned weight words 126 and two non-pruned weight words 120. Since the weights 114a of FIG. 1D include sixteen word weights (and the index weight word 318 is four bits), there would be four index weight words 318 to represent the sixteen word weights.

Referring to the weights 114a of FIG. 1D, the first group of four weight words may be represented by the first index weight word 318 in the encoded weights 314, where the first group includes "0000", "aaaa", "0000", and "0000." The first index weight word 318 of FIG. 3 includes "0100." Since the number of "1s" in the index weight word 318 is one, there should be one non-pruned weight word 120 that follows the first index weight word 318. The first bit in the index weight word 318 indicates that the first weight word is a pruned weight word 126 (e.g., having a value of "0"). The second bit in the index weight word 318 indicates that the second weight word is a non-pruned weight word 120 (e.g., having a value of "1") in which the value of the non-pruned weight word 120 ("aaaa") is located after the index weight word 318. The third bit in the index weight word 318 indicates that the third weight is a pruned weight word 126 (e.g., having a value of "0"). The fourth bit in the index weight word 318 indicates that the fourth weight is a pruned weight word 126 (e.g., having a value of "0").

Then, the second group of four weight words may be represented by the second index weight word 318 in the sequence of encoded weights 314, where the next four weight words are "bbbb", "0000", "0000", and "0000." Since the number of "is" in the second index weight word 318 is one, there should be one non-pruned weight word 120 ("bbbb") that follows the second index weight word 318. The first bit in the index weight word 318 indicates that the first weight word in this set is a non-pruned weight word 120 in which the value of the non-pruned weight word 120 ("bbbb") is located after the second index weight word 318. The second bit in the second index weight word 318 indicates that the second weight word in this set is a pruned weight word 126. The third bit in the second index weight word 318 indicates that the third weight word in this set is a pruned weight word 126. The fourth bit in the index weight word 318 indicates that the fourth weight word in this set is a pruned weight word 126.

Then, the third group of four weight words may be represented by the third index weight word 318 in the sequence of encoded weights 314, where the next four weight words are "cccc", "0000", "dddd", and "0000." Since the number of "Is" in the third index weight word 318 is two, there should be two non-pruned weight word 120 ("cccc", "dddd") that follow the third index weight word 318. The first bit in the third index weight word 318 indicates that the first weight word in this set is a non-pruned weight word 120 in which the value of the non-pruned weight word 120 ("cccc") is located after the second index weight word 318. The second bit in the third index weight word 318 indicates that the second weight word in this set is a pruned weight word 126. The third bit in the third index weight word 318 indicates that the third weight word in this set is a non-pruned weight word 120 in which the value of the non-pruned weight word 120 ("dddd") is located after the weight word of "cccc." The fourth bit in the third index weight word 318 indicates that the fourth weight word in this set is a pruned weight word 126.

Then, the fourth group of four weight words may be represented by the fourth index weight word 318 in the sequence of encoded weights 314, where the next four weight words are "0000", "0000", "0000", and "eeee." Since the number of "Is" in the fourth index weight word 318 is one, there should be one non-pruned weight word 120 ("eeee") that follows the fourth index weight word 318. The first bit in the fourth index weight word 318 indicates that the first weight word in this set is a pruned weight word 126. The second bit in the fourth index weight word 318 indicates that the second weight word in this set is a pruned weight word 126. The third bit in the fourth index weight word 318 indicates that the third weight word in this set is a pruned weight word 126. The fourth bit in the fourth index weight word 318 indicates that the fourth weight word in this set is a non-pruned weight word 120 in which the value of the non-pruned weight word 120 ("eeee") is located after the fourth index weight word 318.

For the encoding scheme 313 of FIG. 3, the decoding logic may be executed on a four-bit word level. In FIG. 3, an arrow 319 represents the number of indexing shifts required to decode the encoded weights 314. In this example, the decompression logic circuit 110 may be required to implement four indexing shifts to decode the encoded weights 314. The details of the decoding performed by the decompression logic circuit 110 is further explained later in the disclosure. In some examples, the decoding logic used to decode the encoded weights 314 of FIG. 3 may be less complex and faster as compared to decoding the encoded weights 214 of FIG. 2.

FIG. 4 illustrates an encoding scheme 413 for encoding the weights 114a of FIG. 1D to generate encoded weights 414 according to an aspect. The encoded weights 414 may be an example of the encoded weights 114 of FIGS. 1A through 1D and may include any of the details discussed wherein with respect to those figures. As discussed above, the weights 114a of FIG. 1D may represent sixteen weight words, which includes the pruned weight words 126 and the non-pruned weight words 120. The encoded weights 414 are generated using an index weight word 418 followed by one or more non-pruned weight words 120 (or none). For example, the encoding scheme 413 uses an index weight word 418 followed by weight words with eight-bit word boundaries.

The number of "1s" in the index weight word 418 indicate the number of non-pruned weight words 120. Referring to FIG. 1D and FIG. 4, since the number of non-pruned weight words 120 is five, there are five "Is" in the index weight word 418. Since the index weight word 418 is eight bits and the four bit word weights are stored in eight bit boundaries, a single index weight word 418 may represent the sixteen weight words of FIG. 1D.

In particular, since the word weights are four bits but the encoding scheme 413 stores them in eight bits, the first bit in the index weight word 418 represents the first two weight words (e.g., 0000, aaaa). Since this pair of weight words includes a non-pruned weight word 120, the first bit in the index weight word 418 has a logic value of "1." The indication of "1" indicates that a weight word follows the index weight word 418. Since the encoding scheme uses an eight bit boundary for four bit weights, the first four bits are "0000" followed by the non-pruned weight word 120 of "aaaa."

Referring to FIG. 1D, the next two word weights are pruned weight words 126 ("0000", "0000"), and therefore, the second bit in the index weight word 418 has a logic value of "0." The value of "0" indicates that no weight words follow (e.g., because they are pruned weight words 126). Then, the next two word weights in the list are "bbbb" and "0000", and since this pair includes a non-pruned weight word 120, the third bit in the index weight word 418 has a logic value of "1", where "bbbb" follows the last weight word of "aaaa." Then, since the next two word weights in the list are "0000" and "0000" (e.g., pruned weight words 126), the fourth bit in the index weight word 418 has a logic value of "0." The next two word weights in the list are "0000" and "cccc", and since this pair includes a non-pruned weight word 120, the fourth bit in the index weight word 418 has a logic value of "1", where "0000" and "cccc" follow the last word weight of "bbbb." The next two word weights in the list are "0000" and "dddd", and since this pair includes a non-pruned weight word 120, the fifth bit in the index weight word 418 has a logic value of "1", where "0000" and "dddd" follow the last word weight of "cccc." The next four word weights in the list are "0000", "0000", "0000", and "0000" and therefore the sixth and seventh bit in the index weight word 418 may have a logic value of "0", but in this example, since the sixth bit in the index weight word 418 has a logic value of "1", the word weighs of "0000" and "0000" follow the last word weight of "dddd." Since the next weight word is "eeee", the eight bit in the index weight word 418 as a logic value of "1", where "eeee" follows the last word weight of "0000."

For the encoding scheme 413 of FIG. 4, the decoding logic may be executed on an eight-bit word level. In FIG. 4, an arrow 419 represents the number of indexing shifts required to decode the encoded weights 314. In this example, the decoding logic may count the number of "1" in the index weight word 418 to determine the number of non-pruned weight words 120 and implement a single indexing shift to decode the sixteen word words of FIG. 1D. In some examples, the decoding logic used to decode the encoded weights 414 of FIG. 4 may be less complex and faster (e.g., much faster) as compared to decoding the encoded weights 314 of FIG. 3.

Figure 5:
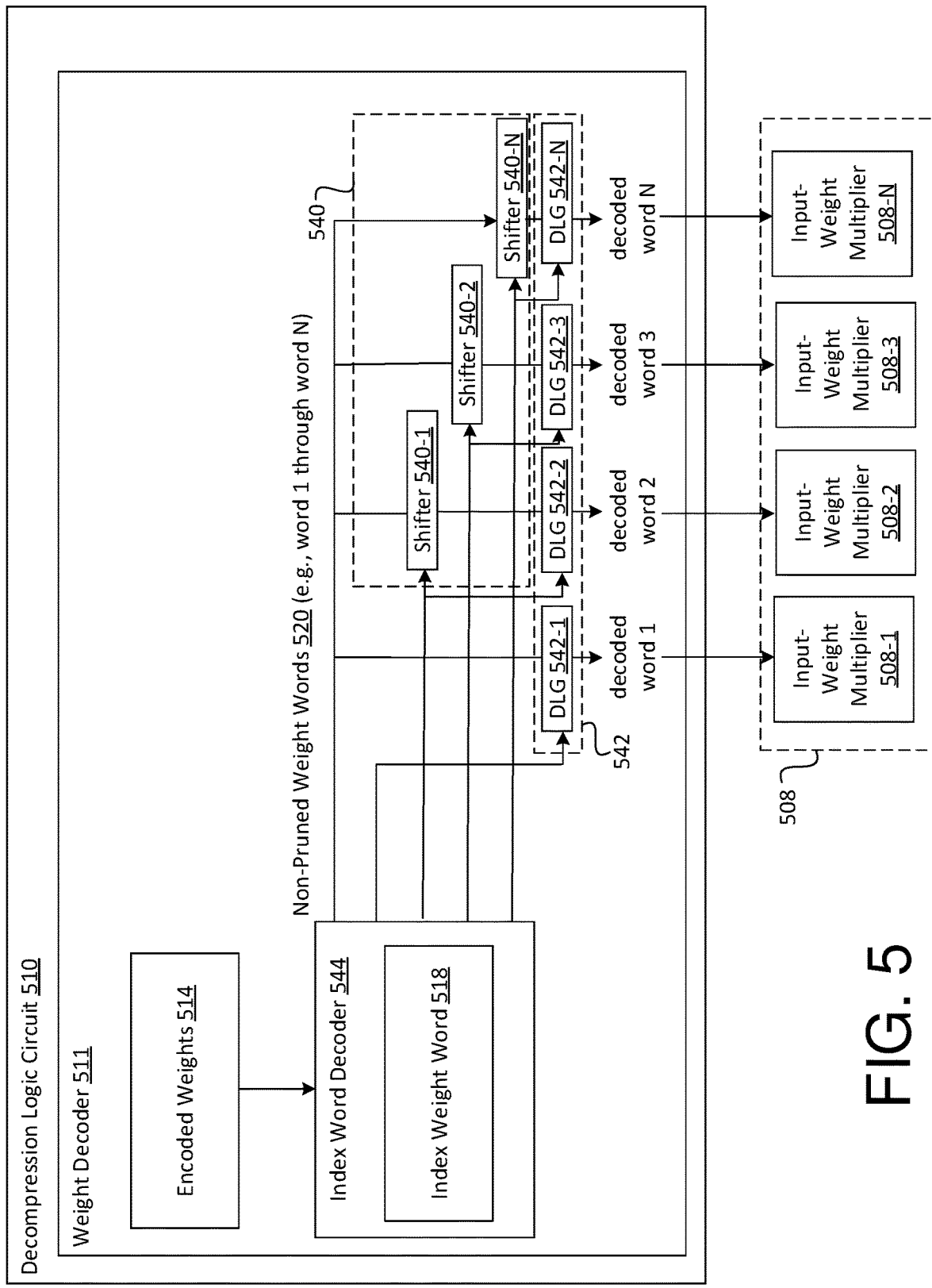
FIG. 5 illustrates a decompression logic circuit for decoding the encoded weights according to an aspect.

FIG. 5 illustrates an example of a decompression logic circuit 510 according to an example. The decompression logic circuit 510 may be an example of the decompression logic circuit 110 of FIGS. 1A through 1D and may include any of the details as discussed with reference to those figures. The decompression logic circuit 510 may include a weight decoder 511 configured to decode encoded weights 514. In some examples, the decompression logic circuit 510 includes multiple weight decoders 511 (e.g., two or more), where each weight decoder 511 decodes a separate portion of the encoded weights 514 (e.g., in parallel or sequentially). The encoded weights 514 may be generated according to any of the encoding schemes discussed herein. In some examples, the encoded weights 514 includes a sequence of an index weight word 518 followed by one or more non-pruned weight words 520 (if any). The index weight word 518 includes a sequence of bits (e.g., four bits, eight bits, sixteen bits, etc.), where each bit has a first bit value (e.g., "0") or a second bit value ("1"). The first bit value may indicate a pruned weight word (e.g., a weight word that has been removed from the encoded weights 514). The second bit value may indicate a non-pruned weight word 520 (e.g., that follows the index weight word 518).

The weight decoder 511 includes an index word decoder 544, a plurality of shifters 540, and a plurality of digital logic gates 542. The shifters 540 includes a first shifter 540-1, and a second shifter 540-2 through N shifter 540-N. The number of shifters 540 may be dependent on the amount of decoded words provided to the input-weight multipliers 508. In some examples, the shifters 540 are connected to the index word decoder 544 in parallel, which may make the decoding relatively fast. In some examples, each shifter 540 is configured to receive the sequence of non-pruned weight words 520 that follow the index weight word 518 and a control signal from the index word decoder 544 that determines the shift operation applied to the sequence of non-pruned weight words 520. In some examples, the shifters 540 include one or more digital circuits that can shift a data word by a specified number of bits. In some examples, the shifters 540 are a sequence of multiplexers. In some examples, the shifters 540 includes a cascade of flip flops. In some examples, the shifters 540 include one or more barrel shifters.

The digital logic gates 542 may include a first digital logic gate 542-1, a second digital logic gate 542-2, and a third digital logic gate 542-3 through N digital logic gate 542-N. The second digital logic gate 542-2 and the third digital logic gate 542-3 through N digital logic gate 542-N may be connected to an output of a respective shifter 540. In some examples, the first decoded word does not require a shifter 540 because a shift operation is not needed (e.g., the first digital logic gate 542-1 receives the non-pruned weight words 520 and a control signal from the index word decoder 544). In some examples, each digital logic gate 542 includes an AND logic gate configured to perform an AND operation.

The first digital logic gate 542-1 is configured to receive the non-pruned weight words 520 (e.g., a shift operation would not be applied on the non-pruned weight words 520 to recover the first decoded word)), the second digital logic gate 542-2 is connected to the output of the first shifter 540-1, and the third digital logic gate 542-3 through N digital logic gate 542-N are connected to the second shifter 540-2 through N shifter 540-N, respectively. Each digital logic gate 542 receives a control signal from the index word decoder 544 to control a Boolean operation (e.g., an AND operation) implemented by a respective digital logic gate 542. For example, the first digital logic gate 542-1 may receive a control signal of "1" or "0" and receive the non-pruned weight words 520, and perform a Boolean operation using "1" or "0" and the non-pruned weight words 520. The output of the first digital logic gate 542-1 is decoded word 1, the output of the second digital logic gate 542-2 is decoded word 2, the output of the third digital logic gate 542-3 is decoded word 3, and the output of the N digital logic 542-N is decoded word N.

In particular, the index word decoder 544 receives the index weight word 518 and control the shifters 540 and the digital logic gates 542 based on the index weight word 518 in order to obtain the decoded words 1 through N. The control signals (or at least a portion of them) generated by the index word decoder 544 to control the shifting performed by the shifters 540 may be based on the bit values of the index weight word 518. Also, the control signals (or at least a portion of them) generated by the index word decoder 544 to control the operations performed by the digital logic gates 542 may be based on the bit values of the index weight word 518.

Using the example of FIG. 4 and FIG. 1D, the index weight word 518 may be "10101101" (e.g., an 8-bit index word). The first digital logic gate 542-1 may receive the sequence of non-pruned weight words 520 (e.g., weight words 1 through N). The control signal generated by the index word decoder 544 to control the first digital logic gate 542-1 may be based on the bit value of the first bit. The first digital logic gate 542-1 may receive the non-pruned weight words 520, and in some examples, the index word decoder 544 may generate and send a control signal of "1" to the first digital logic gate 542-1 since the first bit in the index weight word 518 includes a logic value of "1", which indicates the presence of a non-pruned weight word 520. The first digital logic gate 542-1 may perform an AND operation using "1" and the non-pruned weight words 520, which results in the first decoded word 1 ("0000aaaa").

The first shifter 540-1 may receive the sequence of non-pruned weight words 520, and the index word decoder 544 may control the first shifter 540-1 to not shift the non-pruned weight words 520 (or transmit any shift value as the output of the shifter will not be used) because the bit value of the second bit in the index weight word 518 is "0." The second digital logic gate 542-2 may receive the output of the first shifter 540-1, and in some examples, the index word decoder 544 may generate and send a control signal of "0" to the second digital logic gate 542-2 since the second bit in the index weight word 518 includes a logic value of "0." The second digital logic gate 542-2 may perform an AND operation using "0" and the output of the first shifter 540-1, which results in the decoded word 2 ("00000000").

The second shifter 540-2 may receive the sequence of non-pruned weight words 520, and the index word decoder 544 may control the second shifter 540-2 to shift the non-pruned weight words 520 (one byte or 8 bits) so that the next eight word boundary ("bbbb0000") is aligned at the output of the second shifter 540-2 because the bit value of the third bit in the index weight word 518 is "1", which indicates the presence of a non-pruned weight word 520. The third digital logic gate 542-3 may receive the output of the second shifter 540-2, and in some examples, the index word decoder 544 may generate and send a control signal of "1" to the third digital logic gate 542-3 since the third bit in the index weight word 518 includes a logic value of "1." The third digital logic gate 542-3 may perform an AND operation using "1" and the output of the second shifter 540-2, which results in the decoded word 3 ("bbbb0000"). This process would continue until all the weight words have been recovered from the encoded weights 514. With respect to the example of FIGS. 1D and 4, the number N of shifters 540 would be seven, and the number N of digital logic gates 542 would be eight, thereby obtaining decoded word 1 through decoded word 8 since each decoded word in FIG. 5 contains two weight words for a total of sixteen weight words (e.g., shown in FIG. 1D).

Figure 6:
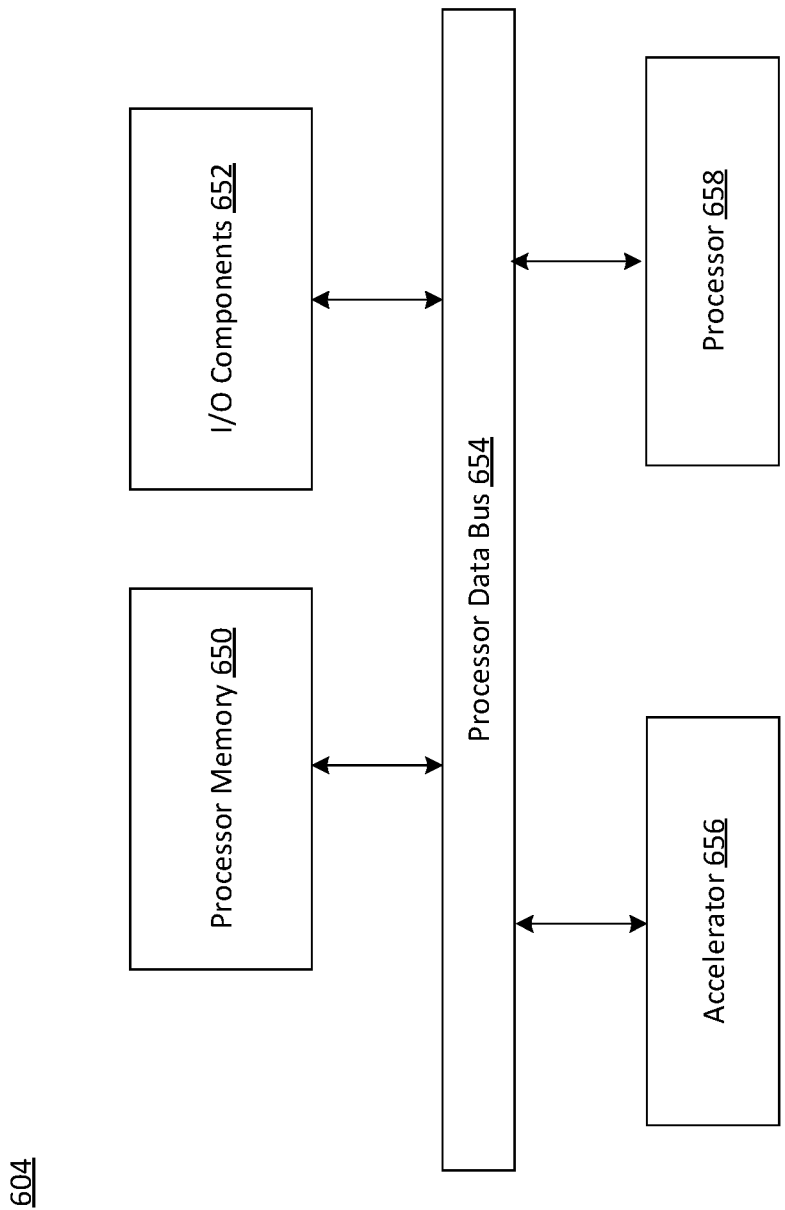
FIG. 6 illustrates a neural network system according to an aspect.

FIG. 6 illustrates a neural network circuit 604 according to an aspect. The neural network circuit 604 may be an example of the neural network circuit 104 of FIGS. 1A through 1D and may include any of the details with respect to those figures and/or the details of FIGS. 2 through 5. The neural network circuit 604 includes a processor memory 650, input/output (I/O) components 652, a processor data bus 654, an accelerator 656, and a processor 658. In some examples, the processor 658 is a host processor. In some examples, the neural network circuit 604 is a system on chip (SOC) (e.g., an integrated circuit coupled to a semiconductor substrate). In some examples, the neural network circuit 604 is part of a speech or sound recognition device. In some examples, the neural network circuit 604 part of a hearing aid device. Although the following description relates to a speech or sound recognition device, the concepts discussed herein may be applied to other applications.

The neural network circuit 604 may receive input values from the I/O components 652 (e.g., a microphone) and to recognize the input values by processing a neural network trained to recognize particular input values as having particular meanings. For example, the input values may be Mel-frequency cepstral coefficients (MFCC) generated from an audio stream. In some examples, frames audio samples are captured periodically (e.g., every 10 milliseconds) and are transformed to a frequency domain for input to the neural network (e.g., the neural network 106 of FIG. 1A).

The processor 658 is coupled to the processor data bus 654. In some examples, the processor 658 may perform a portion (e.g., none, part) of the processing for the neural network via software running on the processor 658. The processor memory 650 is coupled to the processor data bus 654. In some examples, the processor memory 650 includes the weight memory 112 of FIG. 1A and stores the encoded weights 114 of FIG. 1. The accelerator 656 is coupled to the processor data bus 654. The accelerator 656 may be an example of the accelerator 156 of FIG. 1, which includes the decompression logic circuit 110 and the input-weight multipliers 108 of FIG. 1A.

The accelerator 656 may perform a portion (e.g., all, part) of the processing for the neural network. In some examples, the accelerator 656 may use the same processor data bus 654 and the same processor memory 650 as the processor 658. The accelerator 656 may use the processor data bus but when it is not in use by the processor 658. For implementations in which tasks (e.g., computations) of the neural network are split between the accelerator 656 and the processor 658, the accelerator 656 may trigger the processor 658 to perform a task by generating an interrupt. Upon receiving the interrupt, the processor 658 may read input values from the (shared) processor memory 650, perform the task, write the results to the processor memory 650, and return control to (i.e., restart) the accelerator 656.

Figure 7:
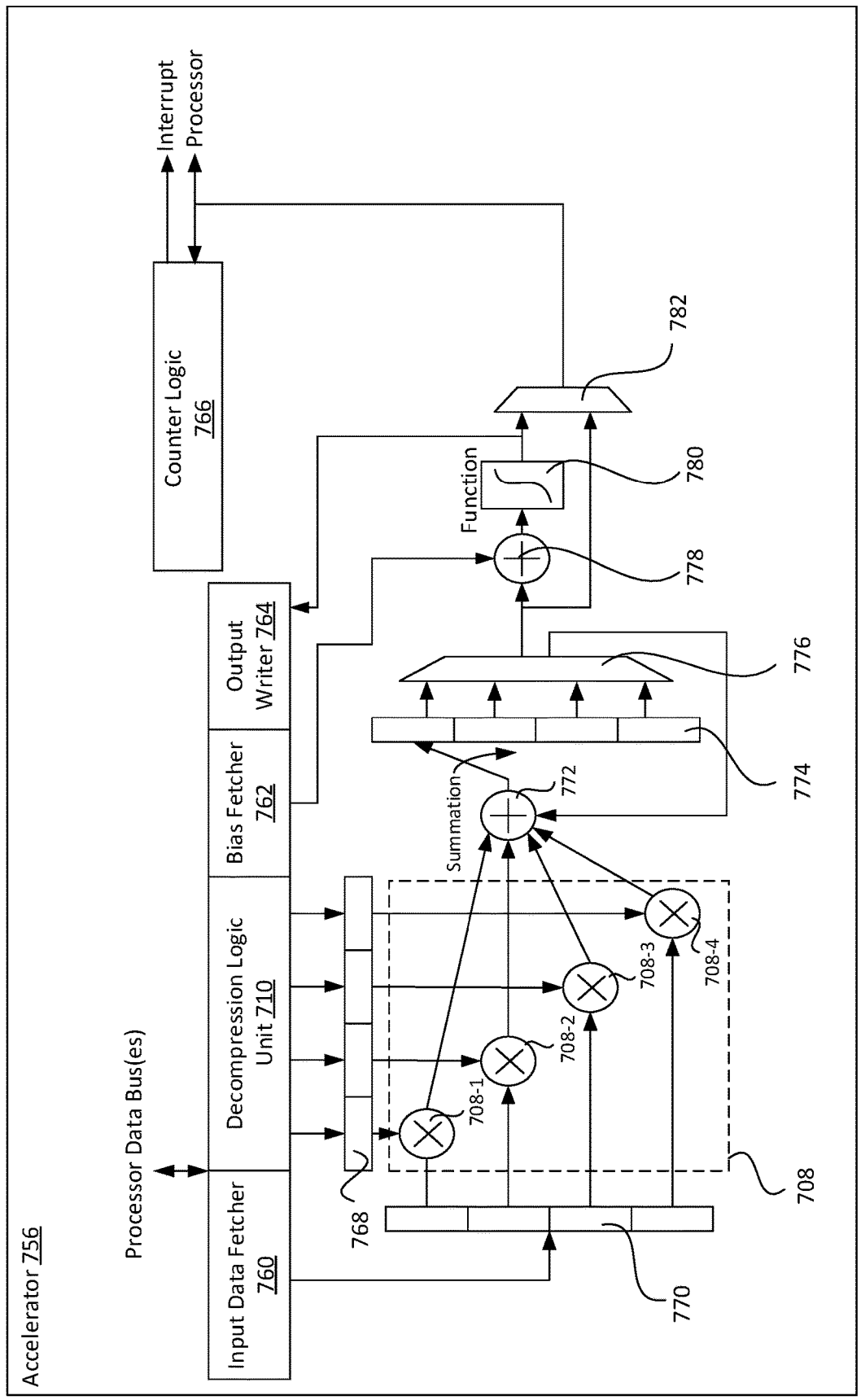
FIG. 7 illustrates an accelerator of the neural network system according to an aspect.

FIG. 7 illustrates an example of an accelerator 756 according to aspect. The accelerator 756 may be an example of the accelerator 156 of FIG. 1A. The accelerator 756 includes an input data fetcher 760, a decompression logic circuit 710, a bias fetcher 762, and an output writer 764. Also, the accelerator 756 includes a counter logic 766 configured to generate an interrupt command and interface with the processor memory 650 of FIG. 6. Each of the input data fetcher 760, the decompression logic circuit 710, the bias fetcher 762, and the output writer 764 may interface with a processor data bus (e.g., the processor data bus 654 of FIG. 6). In some examples, the input data fetcher 760 is a circular buffer. The input data fetcher 760 may receive and store audio samples transformed to a frequency domain. The input data fetcher 760 can hold the audio length on which the neural network is run (e.g., 0.4 to 2 seconds). The decompression logic circuit 710 may be an example of the decompression logic circuit 110 of FIG. 1A. The decompression logic circuit 710 may retrieve the encoded weights from the processor memory 650 of FIG. 6 and decode the encoded weights.

The accelerator 756 also includes input registers 770 configured to receive input data from the input data fetcher 760, and weight registers 768 configured to receive the decoded weights from the decompression logic circuit 710. The accelerator 756 includes a plurality of input-weight multipliers 708 that multiply the decoded weights from the weight registers 768 with the input data from the input registers 770. The input-weight multipliers 708 include four multipliers, e.g., a first input-weight multiplier 708-1, a second input-weight multiplier 708-2, a third input-weight multiplier 708-3, and a fourth input-weight multiplier 708-4. Although four input-weight multipliers 708 are shown in FIG. 7, the number of input-weight multipliers 708 may be any number greater than four, such as twenty input-weight multipliers 708, forty input-weight multipliers 708, sixty input-weight multipliers 708, etc. The accelerator 756 includes a summation unit 772 configured to sum the results of the input-weight multipliers 708, accumulator registers 774 to receive the results of the summation unit 772, and an accumulator 776 to accumulate the contents of the accumulator registers 774. The accelerator 756 includes a bias adder 778 that receives the bias the bias fetcher 762 and adds the bias to the output of the accumulator 776. The accelerator 756 includes a look up table (LUT) 601 that implements the activation function, and a multiplexer 782 configured to generate the output of the neural network layer.

The operation of the accelerator 756 generally includes the processing of multiple neurons (e.g. four as shown) over multiple synapses (i.e., weights). In the first cycle, four synapses associated with a first neuron are multiplied with four inputs (e.g., layer inputs) and the sum is stored in one of the accumulator registers 774. In the next cycle, a different set of synapses associated with a second neuron is multiplied with the (same) four inputs and the accumulated sum is stored in the next register of the accumulator registers 774. This process is repeated until all accumulator registers 774 are written. Once all accumulator registers 774 are written, a new set of four inputs for the first neuron are obtained, multiplied by weights, and accumulated with the previously stored register value. The process is continued until each node in the layer is computed. At this point, a bias is applied by the bias adder 778 to the neuron value and an activation function is applied by a lookup table 780 to the neuron value before being applied to the multiplexer 782.

In some examples, the accelerator 756 allows for software to control the neural network processing and either hardware or software to apply the activation function. The application of the activation function is configurable by selecting one of the inputs to the multiplexer 782. The upper input of the multiplexer 782 is selected when using hardware and the bottom input of the multiplexer 782 is selected when using software. When the activation function is applied in hardware, a write back of activation values is possible and a whole layer can be processed without interaction with the host processor (e.g., the processor 658 of FIG. 6). In operation, a bias may be fetched from the memory and adding the bias to the accumulated sum. Then, the activation function may be performed in hardware and the resulting neuron values are stored in memory. This process may repeat for other neurons in the layer. After a number of neurons have been processed and stored, an interrupt can be generated (by the counter logic 766) for the host processor (e.g., the processor 658 of FIG. 6). Upon receiving the interrupt and after updating the registers, the host processor (e.g., the processor 658 of FIG. 6) can restart the accelerator 756 again for the next layer and the process repeats until the complete neural network has been processed.

Figure 8:
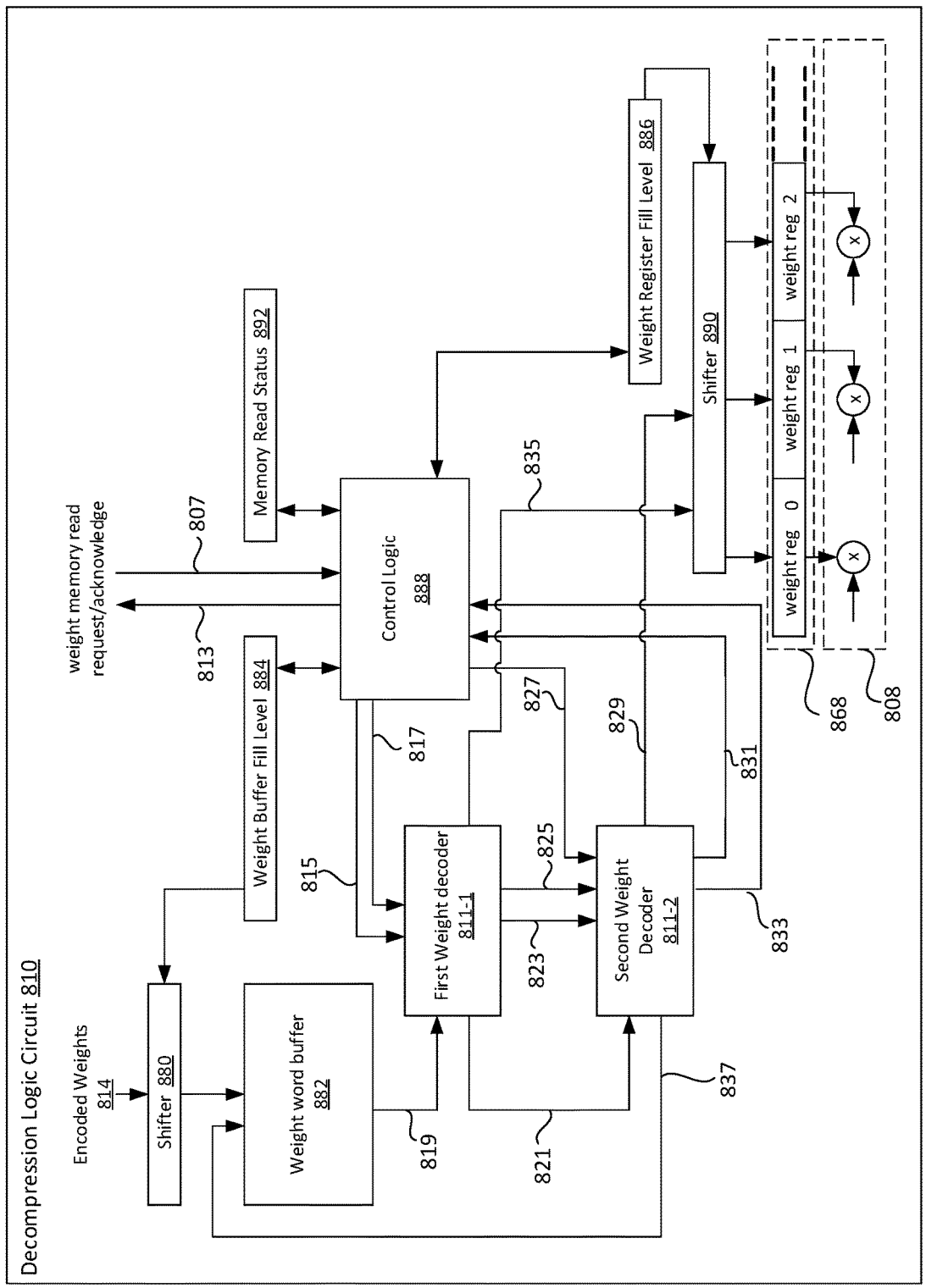
FIG. 8 illustrates a decompression logic circuit of the accelerator according to an aspect.

FIG. 8 illustrates an example of a decompression logic circuit 810. The decompression logic circuit 810 may be an example of the decompression logic circuit 110 of FIG. 1A and/or the decompression logic circuit 710 of FIG. 7 and may include any of the details discussed herein. The decompression logic circuit 810 includes a shifter 880, a weight word buffer 882, a first weight decoder 811-1, a second weight decoder 811-2, a control logic 888, a shifter 890, and weight registers 868.

The shifter 880 may align encoded weights 814 into the weight word buffer 882 from the weight memory (e.g., the processor memory 650 of FIG. 6 or the weight memory 112 of FIG. 1A) according to a weight buffer fill level 884 that is computed by the control logic 888. In some examples, the control logic 888 is configured to transmit a weight memory read request (via arrow 813) to the memory and receive an acknowledgement message (via arrow 807). In some examples, the control logic 888 is configured to determine a memory read status 892 to determine the level of encoded weights 814 read from the memory. The encoded weights 814 may be encoded according to any of the encoding techniques discussed herein.

The shifter 880 may receive the encoded weights 814 from memory (e.g., the processor memory 650 of FIG. 6, the weight memory 112 of FIG. 1A) and align the encoded weights 814 into the weight word buffer 882. The weight word buffer 882 may temporarily store the encoded weights 814 until the encoded weights 814 are provided to the first weight decoder 811-1 (via arrow 819). In some examples, the first weight decoder 811-1 is configured to decode any number of weight words up to a maximum number within a single clock cycle. The maximum number of weight words may be eight weight words, sixteen, thirty-two weight words, etc.

In one example, if the maximum number of weight words capable of being decoded by the first weight decoder 811-1 is sixteen but the total number of weight words is thirty-two weight words, the first weight decoder 811-1 may provide the remaining weight word to the second weight decoder 811-2 (via arrow 821). Then, if there are any remaining words, the second weight decoder 811-2 provides those remaining words back to the weight word buffer 882 (via arrow 837). As such, in some examples, the first weight decoder 811-1 may decode a portion of the encoded weights 814 and the second weight decoder 811-2 may decode the other portion of the encoded weights 814. In some examples, the first weight decoder 811-1 receives a first index weight word and the sequence of non-pruned weight words, and then decodes the first index weight word to obtain a first group of weight words, and the second weight decoder 811-2 receives a second index weight word (e.g., a subsequent index weight word) and the remaining non-pruned weight words, and then decodes the second index weight word to obtain a second group of weight words. Although two weight decoders 811 are depicted, the decompression logic circuit 810 may include any number of weight decoders 811 (which may be dependent upon the specific implementation).

The first weight decoder 811-1 may receive a signal from the control logic 888 (via arrow 815), where the signal indicates a number of available buffer words. For example, if the compression scheme uses an eight bit compression size, each weight word is eight bits (or one byte). If the weight word buffer 882 contains four weight words (e.g., one index weight word plus three non-pruned weight words), the signal from the control logic 888 would indicate the number four for the number of available buffer words.

In other words, the control logic 888 may monitor and track the weight buffer fill level 884 (e.g., the amount of weight words in the weight word buffer 882). The number of available buffer words may be the amount of weight words stored in the weight word buffer 882 that are available for decoding. In some examples, the first weight decoder 811-1 may receive the amount of available buffer words in the weight word buffer 882 (via arrow 815) to determine whether there is a sufficient number of weight words to decode them. In some examples, the first weight decoder 811-1 may also receive a signal from the control logic 888 (via arrow 817), where the signal includes a decode request. In some examples, the decode request includes the number of weights requested. For example, the control logic 888 may determine the amount of weights to be decoded by the first weight decoder 811-1 and transmit that number in a signal (via arrow 817) to the first weight decoder 811-1. In some examples, the first weight decoder 811-1 may compare the number of weights requested (received via arrow 817) and the number of available buffer words (received via arrow 815) to determine whether to decode the encoded weights 814 in the weight word buffer 882. For example, if the number of available buffer words is equal to or greater than the number of weights requested, the first weight decoder 811-1 may decode the weight words of the encoded weights 814 and provide the decoded words to a shifter 890 (via arrow 835).

In some examples, the first weight decoder 811-1 generates and sends a signal to the second weight decoder 811-2 (via arrow 823), where the signal indicates the amount of used words (e.g., the amount of weight words that have been decoded by the first weight decoder 811-1). Also, the first weight decoder 811-1 generates and sends a signal to the second weight decoder 811-2 (via arrow 825), where the signal indicates the number of decoded words available. In some examples, the first weight decoder 811-1 generates and sends a signal to the second weight decoder 811-2 (via arrow 821), where the signal includes remaining words. The remaining words may be the weight words that are still available (e.g., the ones that exceed the maximum number of weight words capable of being decoded by the first weight decoder 811-1 and are available in the weight word buffer 882).

The second weight decoder 811-2 may receive the remaining words (via arrow 821), the number of used words (via arrow 823), and the number of decoded words available (via 825) from the first weight decoder 811-1. Also, the second weight decoder 811-2 may receive a decode request (via arrow 827) from the control logic 888. The second weight decoder 811-2 may decode the remaining words from the encoded weights 814 and provide the decoded words (via arrow 829) to the shifter 890. If there are any remaining words left after the second weight decoder 811-2 performs the decoding operations, the second weight decoder 811-2 returns those remaining words (via arrow 837) back to the weight word buffer 882. Furthermore, the second weight decoder 811-2 may generate and send a signal to the control logic 888 (via arrow 831), where the signal indicates the number of decoded words available. Also, the second weight decoder 811-2 may generate and send a signal to the control logic 888 (via arrow 833), where the signal indicates the number of used words (e.g., the number of weight words decoded by the second weight decoder 811-2).

The decompression logic circuit 810 includes a shifter 890, and weight registers 868. The weight registers 868 may be an example of the weight registers 768 of FIG. 7. The shifter 890 may receive the decoded words from the first weight decoder 811-1 (via arrow 835) and/or the second weight decoder 811-2 (via arrow 829) and align the decoded words into the appropriate weight registers 868. Then, the decoded words from the weight registers 868 are provided to corresponding input-weight multipliers 808. The input-weight multipliers 808 may be an example of the input-weight multipliers 708 of FIG. 7. In some examples, the control logic 888 may communicate with the shifter 890 to monitor the amount of weights in the weight registers 868. For example, the control logic 888 may determine a weight register fill level 886 based on information received from the shifter 890 and control the amount of decoded words that are placed into the weight registers 868 based on the weight register fill level 886.

In some examples, new decoded weight words are provided to the weight registers 868 every clock cycle. In some examples, the number of input-weight multipliers 808 is sixteen, and the decompression logic circuit 810 is configured to decode sixteen weights in one clock cycle. In some examples, the clock cycle is greater than twenty megahertz. In some examples, the clock cycle is greater than forty megahertz. In some examples, the clock cycle is greater than sixty megahertz.

The following description describes an example operation of the decompression logic circuit 810 for decompressing eighty weights that have been compressed using weight pruning according to the encoding scheme 413 of FIG. 4. Table 1 below provides the contents of a thirty-two bit memory that stores compressed weights in little endian format (e.g., first weight word is in the top, right box, and read right to left). For example, these compressed weights may be stored in the weight memory 112 of FIG. 1A or the processor memory 650 of FIG. 6.

TABLE 1

| cccc0000 | bbbb0000 | 0000aaaa | 10101101 |
| 0000ffff | 01101010 | 0000eeee | dddd0000 |
| 00000100 | kkkkjjjj | iiii0000 | hhhhgggg |

TABLE 1-continued

| 0000mmmm | 11010001 | 00000000 | 11110000 |
| xxxxxxxx | qqqq0000 | 0000pppp | oooonnnn |

In this example, the weight word size is four bits, and the compression word size is eight bits, and the bolded numbers indicate the index weight words (e.g., the index weight words 418 of FIG. 4). In some examples, the decompression logic circuit 810 decodes the weights stored in Table 1 to obtain eighty weights (e.g., forty weight words, each weight word is four bits), which is provided to sixteen input-weight multipliers 808. With this configuration up to eight weight words are requested as therefore only the first weight decoder 811-1 is used.

In the initial state, the buffer length of the weight word buffer 882 is zero, and the contents of the weight word buffer 882 is empty. The first weight decoder 811-1 receives the number of requested weights (via arrow 817) from the control logic 888. In this example, the number of requested weights is eight since that is the number that the first weight decoder 811-1 is capable of decoding. Also, the first weight decoder 811-1 receives the number of available words (via arrow 815). In this example, the number of available words is zero because the weight word buffer 882 is empty (e.g., no words are available yet). Because the number of available words is less than the number of weight words requested, the first weight decoder 811-1 is configured to not execute the decoding operation. Also, the first weight decoder 811-1 may determine that the number of used words is zero (e.g., because no weight words have been decoded) and the number of remaining words is zero.

The decompression logic circuit 810 may read the encoded weights 814 from memory. The following description uses a thirty-two bit read (e.g., four bytes of data, which, since the compressed word size is eight bits (or one byte), it would read four weight words for each read). However, the decompression logic circuit 810 may read any number of bits from the memory, including memory reads of greater than thirty-two bits.

For example, the decompression logic circuit 810 is configured to perform a first read from the memory content, where the shifter 880 aligns the following weights in the weight word buffer 882: cccc0000; bbbb0000; 0000aaaa; 10101101. After the first read, the buffer length of the weight word buffer 882 is four (e.g., four bytes of data), and the buffer content of the weight word buffer 882 includes: cccc0000; bbbb0000; 0000aaaa; 10101101. The first weight decoder 811-1 receives the number of requested weights (via arrow 817) from the control logic 888. In this example, after the first read, the number of requested weights is eight since that is the number that the first weight decoder 811-1 is capable of decoding. Also, the first weight decoder 811-1 receives the number of available decoded weight words (via arrow 815). In this example, the number of available decoded weight words is zero. The first weight decoder 811-1 may count the number of is in the index weight word (which is five). Since the weight word buffer 882 includes only three bytes of data (but needs five bytes of data to decode the first index weight word), the first weight decoder 811-1 is configured to not execute the decoding operation because there is not sufficient number of weight words in the weight word buffer 882. Also, the first weight decoder 811-1 may determine that the number of used words is zero (e.g., because no weight words have been decoded) and the number of remaining words is four (e.g., since they are four eight-bit weight words).

Then, the decompression logic circuit 810 is configured to perform a second read from the memory content (e.g., another 32 bit read from memory). After the second read, the buffer length of the weight word buffer 882 is eight (e.g., eight bytes of data), and the buffer content of the weight word buffer 882 includes: 0000ffff; 01101010; 0000eeee; dddd0000; cccc0000; bbbb0000; 0000aaaa; 10101101. The first weight decoder 811-1 receives the number of requested weights (via arrow 817) from the control logic 888. In this example, after the second read, the number of requested weights is eight since that is the number that the first weight decoder 811-1 is capable of decoding. Also, the first weight decoder 811-1 receives the number of available decoded weight words (via arrow 815). In this example, the number of available decoded weight words is eight. The first weight decoder 811-1 counts the number of is in the index weight word, and, since the number of weight words in the weight word buffer 882 is equal to or greater than the number of is in the index weight word, the first weight decoder 811-1 is configured to decode the weight words to obtain a group of decoded weight words. The first weight decoder 811-1 is configured to decode six weight words (e.g., the index weight word of "10101101" plus the five weight words that follow this index word in little endian format). In other words, in order to determine the number of use words, the first weight decoder 811-1 may count the number of 1's in the index weight word (which is five) and then add one for the index weight word itself for a total of six used words. Then, the first weight decoder 811-1 may determine the number of remaining words, which, in this example, is two (e.g., the amount of weight words (8) minus the amount of used words (6)).

Then, the decompression logic circuit 810 is configured to perform a third read from the memory content. After the third read, the buffer length of the weight word buffer 882 is six (e.g., six bytes of data), and the buffer content of the weight word buffer 882 includes: 00000100; kkkkjjjj; iiii0000; hhhhgggg; 0000ffff; 01101010. The first weight decoder 811-1 receives the number of requested weights (via arrow 817) from the control logic 888. In this example, after the third read, the number of requested weights is eight since that is the number that the first weight decoder 811-1 is capable of decoding. Also, the first weight decoder 811-1 receives the number of available decoded word weight words (via arrow 815). In this example, the number of available words is eight. Again, the first weight decoder 811-1 determines the number of is in the index weight word (which is four), and, since the weight word buffer 882 includes at least four bytes of data, the first weight decoder 811-1 is configured to decode the weights. After the third read, the first weight decoder 811-1 is configured to decode five weight words (e.g., the index weight word of "01101010" plus the four weight words that follow this index word in little endian format). In other words, in order to determine the number of use words, the first weight decoder 811-1 may count the number of 1's in the index weight word (which is four) and then add one for the index weight word itself for a total of five used words. Then, the first weight decoder 811-1 may determine the number of remaining words, which, in this example, is one (e.g., the amount of weight words in the buffer (6) minus the amount of used words (5)).

Then, the decompression logic circuit 810 is configured to perform a fourth read from the memory content. After the fourth read, the buffer length of the weight word buffer 882 is five (e.g., five bytes of data), and the buffer content of the weight word buffer 882 includes: 0000mmmm; 11010001; 00000000; 11110000; 00000100. The first weight decoder 811-1 receives the number of requested weights (via arrow 817) from the control logic 888. In this example, after the fourth read, the number of requested weights is eight since that is the number that the first weight decoder 811-1 is capable of decoding. Also, the first weight decoder 811-1 receives the number of available decoded weight words (via arrow 815). In this example, the number of available decoded weight words is eight. Because the number of is in the index weight word is equal to or greater than the number of weight words in the weight word buffer 882, the first weight decoder 811-1 is configured to decode the weights. After the fourth read, the first weight decoder 811-1 is configured to decode the weights using two weight words (e.g., the index weight word of "00000100" plus the one weight word that follow this index word in little endian format). In other words, in order to determine the number of use words, the first weight decoder 811-1 may count the number of is in the index weight word (which is one) and then add one for the index weight word itself for a total of two used words. Then, the first weight decoder 811-1 may determine the number of remaining words, which, in this example, is three (e.g., the amount of weight words in the buffer (5) minus the amount of used words (3)).

Then, the decompression logic circuit 810 is configured to perform a fifth read from the memory content. After the fifth read, the buffer length of the weight word buffer 882 is seven (e.g., seven bytes of data), and the buffer content of the weight word buffer 882 includes: XXXXXXXX; qqqq0000; 0000pppp; oooonnnn; 0000mmmm; 11010001; 00000000. The first weight decoder 811-1 receives the number of requested weights (via arrow 817) from the control logic 888. In this example, after the fifth read, the number of requested weights is eight since that is the number that the first weight decoder 811-1 is capable of decoding. Also, the first weight decoder 811-1 receives the number of available decoded weight words (via arrow 815). In this example, the number of available decoded weight words is eight. Since the number of is (which is zero) is equal to greater than the number of weight words in the weight word buffer 882, the first weight decoder 811-1 is configured to decode the weights. After the fifth read, the first weight decoder 811-1 is configured to decode the weights using one weight word (e.g., the index weight word of "00000000"). Then, the first weight decoder 811-1 may determine the number of remaining words, which, in this example, is six (e.g., the amount of weight words in the buffer (7) minus the amount of used words (1)).

After the fifth read, there is not a need to read from the memory since the contents of the memory have already been read. After the fifth read, the buffer length of the weight word buffer 882 is now six, and the buffer content of the weight word buffer 882 includes: XXXXXXXX; qqqq0000; 0000pppp; oooonnnn; 0000mmmm; 11010001. The number of weights requested is eight, and the number of available decoded weight words is eight. The first weight decoder 811-1 decodes the weights 814 using five weight words, and the remaining word is one (e.g., XXXXXXXX). In this manner, all the decoded weights are provided to the input-weight multipliers.

Figure 9:
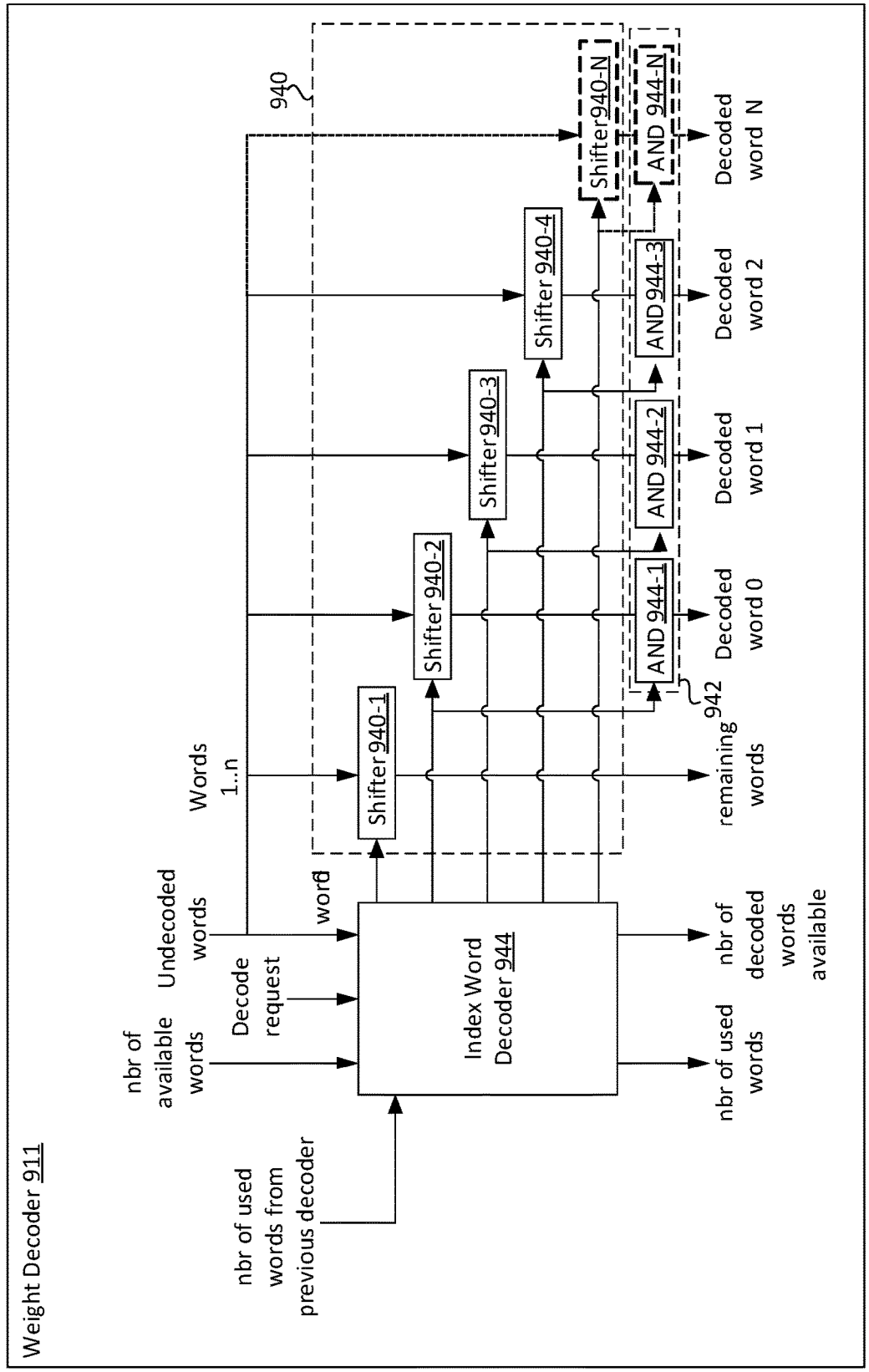
FIG. 9 illustrates a weight decoder of the decompression logic circuit according to an aspect.

FIG. 9 illustrates an example of a weight decoder 911 according to an aspect. The weight decoder 911 may be the first weight decoder 811-1 or the second weight decoder 811-2 of FIG. 8. Also, the weight decoder 911 may be an example of the weight decoder 511 of FIG. 5.

The weight decoder 911 is configured to decode encoded weights. The encoded weights may be generated according to any of the encoding schemes discussed herein. In some examples, the encoded weights includes a sequence of an index weight word followed by one or more non-pruned weight words (if any). The index weight word includes a sequence of bits (e.g., four bits, eight bits, sixteen bits, etc.), where each bit has a first bit value (e.g., "0") or a second bit value ("1"). The first bit value may indicate a pruned weight word (e.g., a weight word that has been removed from the encoded weights). The second bit value may indicate a non-pruned weight word (e.g., that follows the index weight word).

The weight decoder 911 includes an index word decoder 944, a plurality of shifters 940, and a plurality of AND gates 942. The shifters 940 includes a first shifter 940-1, a second shifter 940-2, a third shifter 940-3, and a fourth shifter 940-4 through N shifter 940-N. In some examples, the shifters 940 are connected to the index word decoder 944 in parallel, which may make the decoding relatively fast. In some examples, each shifter 940 is configured to receive the sequence of non-pruned weight words that follow the index weight word and a control signal from the index word decoder 944 that determines the shift operation applied to the sequence of non-pruned weight words. For example, in FIG. 9, the first word (word 0) may be considered the index weight words, and the following words (words 1 . . . n) may be considered the non-pruned weight words.

The weight decoder 911 may receive the number of used words from the previous decoder (e.g., if the weight decoder 911 is the second weight decoder 811-2 of FIG. 8), the number of available words (e.g., the number of weight words available in the weight word buffer 882 of FIG. 8), the decode request (which requests a number of decoded weight words, e.g., eight decoded weight words, etc.), and undecoded words (e.g., index weight words and non-pruned weight words). The weight decoder 911 may compute the number of used words, e.g., the number of weight words (including non-pruned weight words, index weight word) that are used to decode the weights. Also, the weight decoder 911 may generate and send the number of decoded available weight words.

The AND gates 942 may include a first AND gate 942-1, a second AND gate 942-2, and a third AND gate 942-3 through N AND gate 942-3. With the exception of the first shifter 940-1 (which outputs the remaining words), each AND gate 942 may be connected to an output of a separate shifter 940. In the example of FIG. 9, the first AND gate 942-1 is connected to the output of the second shifter 940-2, the second AND gate 942-2 is connected to the output of the third shifter 940-3, and the third AND gate 942-3 through N AND gate 942-N are connected to the fourth shifter 940-4 through N shifter 940-N, respectively.

Each AND gate 942 receives a control signal from the index word decoder 944 to control an AND operation implemented by a respective AND gate 942. For example, the first AND gate 942-1 may receive a control signal of "1" or "0" and receive the output of the second shifter 940-2, and perform a Boolean operation using "1" or "0" and the output of the second shifter 940-2. The output of the first AND gate 942-1 is decoded word 0, the output of the second AND gate 942-2 is decoded word 1, the output of the third AND gate 942-3 is decoded word 2, and the output of the N AND gate 942-N is decoded word N.

In particular, the index word decoder 944 receives the index weight word (word 0) and controls the shifters 940 and the AND gates 942 based on the index weight word in order to obtain the decoded words 0 through N and provide the remaining words to another weight decoder or back to the buffer. The control signals (or at least a portion of them) generated by the index word decoder 944 to control the shifting performed by the shifters 940 may be based on the bit values of the index weight word. Also, the control signals (or at least a portion of them) generated by the index word decoder 944 to control the operations performed by the AND gates 942 may be based on the bit values of the index weight word (e.g., the index weight word 118, 318, 418, or 518).

Using the encoding scheme 413 of FIG. 4 (and the weights of FIG. 1D), the index weight word may be "10101101" (e.g., an 8-bit index word). The first shifter 940-1 may receive the sequence of non-pruned weight words (words 1 . . . n), and the index word decoder 944 may control the first shifter 940-1 to shift five bytes so that the remaining words are outputted from the first shifter 940-1. For example, the index word decoder 944 may count the number of 1s in the index weight word, and since the number of 1s is five (meaning that five weight words follow the index weight word), the index word decoder 944 may control the first shifter 940-1 to shift five bytes (e.g., each compressed weight word is eight bits in the encoding scheme 413 of FIG. 4) so that the remaining words can be provided to the next decoder or back to the buffer.

The second shifter 940-2 may receive the sequence of non-pruned weight words, and the index word decoder 944 may control the second shifter 940-1 to not shift the non-pruned weight words so that the first compressed weight word (e.g., word 1) is aligned with the second shifter 940-2, which is "0000aaaa." In some examples, the second shifter 940-2 is omitted (e.g., similar to the embodiment of FIG. 5) since the second shifter 940-2 would not have to shift. In those examples, the arrow from the undecoded words would be extended to the first AND gate 942-1. The control signal generated by the index word decoder 944 to control the first AND gate 942-1 (connected to the second shifter 940-2) may be based on the bit value of the first bit of the index weight word. The first AND gate 942-1 may receive the output of the second shifter 940-2, and in some examples, the index word decoder 944 may generate and send a control signal of "1" to the first AND gate 942-1 since the first bit in the index weight word includes a logic value of "1", which indicates the presence of a non-pruned weight word. The first AND gate 942-1 may perform an AND operation using "1" and the output of the second shifter 940-2, which results in the decoded word 0 ("0000aaaa").

The third shifter 940-3 may receive the sequence of non-pruned weight words (words 1 . . . 2), and the index word decoder 944 may control the third shifter 940-3 to not shift the non-pruned weight words ((or transmit any shift value as the output of the shifter will not be used)) because the bit value of the second bit in the index weight word is "0." In some examples, the third shifter 940-3 may only shift with word 1 and word 2 as inputs, therefore, the third shifter 940-3 may be a two-input multiplexer. Also, the control signal generated by the index word decoder 944 to control the second AND gate 942-2 may be based on the bit value of the second bit in the index weight word. The second AND gate 942-2 may receive the output of the third shifter 940-9, and in some examples, the index word decoder 944 may generate and send a control signal of "0" to the second AND gate 942-2 since the second bit in the index weight word includes a logic value of "0." The second AND gate 942-2 may perform an AND operation using "0" and the output of the third shifter 940-3, which results in the decoded word 1 ("00000000").

The fourth shifter 940-4 may receive the sequence of non-pruned weight words (words 1 . . . 3), and the index word decoder 944 may control the fourth shifter 940-4 to shift the non-pruned weight words (one byte or 8 bits) so that the next weight word ("bbbb0000") is aligned with the fourth shifter 940-4 because the bit value of the third bit in the index weight word is "1", which indicates the presence of a non-pruned weight word. Also, the control signal generated by the index word decoder 944 to control the third AND gate 942-3 may be based on the bit value of the third bit in the index weight word. The third AND gate 942-3 may receive the output of the fourth shifter 940-4, and in some examples, the index word decoder 944 may generate and send a control signal of "1" to the third AND gate 942-3 since the third bit in the index weight word includes a logic value of "1." The third AND gate 942-2 may perform an AND operation using "1" and the output of the fourth shifter 940-4, which results in the decoded word 2 ("bbbb0000"). This process would continue until all the weight words have been recovered from the encoded weights. With respect to the example of FIGS. 1D and 4, the number N of shifters 940 would be eight, and the number N of AND gates 942 would be eight, thereby obtaining decoded word 0 through decoded word 7 since each decoded word in FIG. 4 contains two weight words for a total of sixteen uncompressed weight words.

As shown above, the pruned weight words are decoded to zero-value weight words, and the multiplications using the zero-value weight words are being executed by the input-weight multipliers (e.g., the input-weight multipliers 108, 508, 708, or 808). In other words, in contrast to some conventional approaches that skip the multiplications, even if the weight word is pruned, the multiplication is still performed in hardware (e.g., zeros are fed to the input-weight multiplier).

Figure 10:
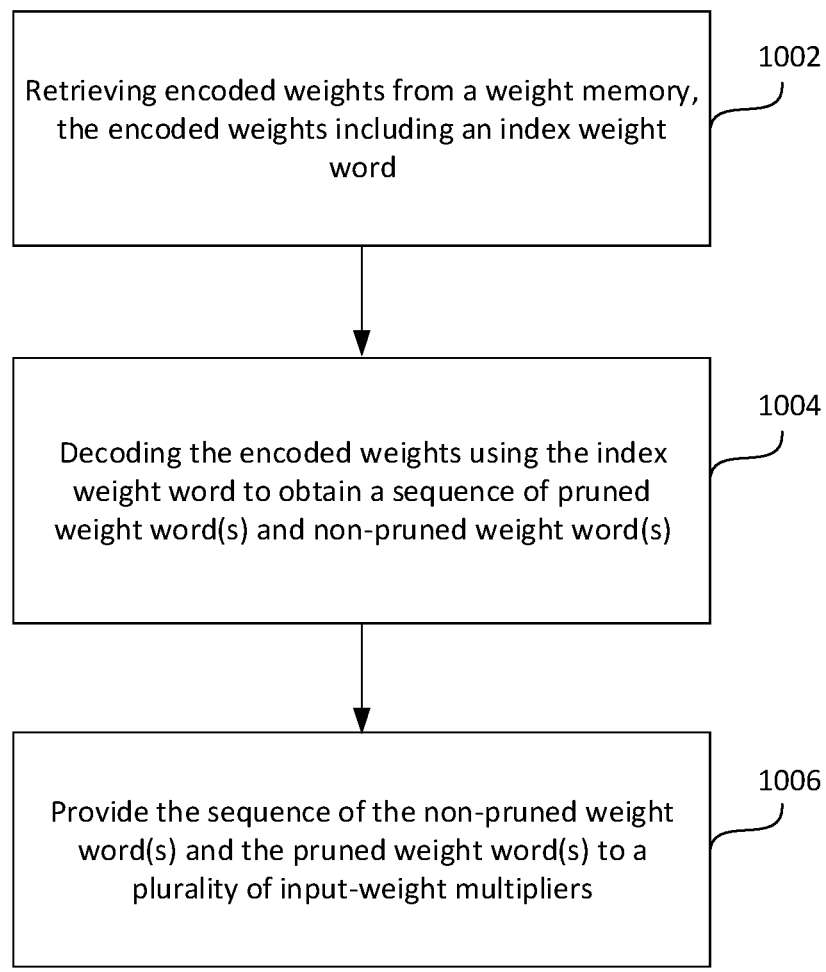
FIG. 10 is a flowchart of a method for decoding weights of a neural network system according to an aspect.

FIG. 10 illustrates a flowchart 1000 depicting example operations of decoding encoded weights for a neural network. Although the flowchart 1000 of FIG. 10 is described with respect to the neural network system 100 of FIGS. 1A through 1D, the flowchart 1000 may be applicable to any of the embodiments discussed herein. In some examples, the neural network system 100 is part of a device 102 (e.g., a speech recognition device). In some examples, the device 102 is a hearing aid device that receives speech (e.g., a voice command) and then uses a neural network 106 to determine which command corresponds to the speech.

Operation 1002 includes retrieving encoded weights 114 from a weight memory 112, where the encoded weights includes an index weight word 118. The encoded weights 114 may be encoded according to any of the encoding schemes discussed herein. In some examples, the index weight word 118 includes a plurality of bits, where each bit has a first bit value (e.g., zero) or a second bit value (e.g., one). The first bit value indicates a pruned weight word 126 in the sequence, and the second bit value indicates a non-pruned weight word 120 in the sequence. Also, one or more non-pruned weight words 120 may follow the index weight word 118.

Operation 1004 includes decoding the encoded weights 114 using the index weight word 118 to obtain a sequence of one or more pruned weight words 126 and one or more non-pruned weight words 120. In some examples, the pruned weight words 126 include zero-value weight words, and the non-pruned weight words 120 include non-zero-value weight words. In some examples, the pruned weight word 126 is decoded to zero in response to a bit within the index weight word 118 having the first bit value (e.g., zero). In some examples, the decoding includes controlling a plurality of shifters (e.g., shifters 540 of FIG. 5) and a plurality of digital logic gates 542 based on the index weight word 126. In some examples, the encoded weights 114 are decoded within a single clock cycle. In some examples, the clock cycle is between fifteen megahertz and eighty megahertz.

Operation 1006 includes providing the sequence of the non-pruned weight words 120 and the pruned weight words 126 to a plurality of input-weight multipliers 108. For example, even if the weight word is pruned, the multiplication is still performed in hardware, where zeros are fed to the input-weight multiplier 108.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components, and/or features of the different implementations described.

What is claimed is:

1. A neural network circuit for decoding weights of a neural network, the neural network circuit comprising:
   a weight memory configured to store encoded weights for the neural network, the encoded weights including an index weight word and a set of non-zero-value weight words; and a weight decoder configured to retrieve the encoded weights from the weight memory, decode the encoded weights using the index weight word to generate decoded weights, and provide the decoded weights to a plurality of input-weight multipliers, the decoded weights having one or more zero-value weight words within the set of non-zero-value weight words, the weight decoder including:
a plurality of shifters, including a first shifter and a second shifter, configured to execute a shift operation on the set of non-zero-value weight words based on a respective bit value of the index weight word, a number of the plurality of shifters corresponding to a number of non-zero-value weight words in the set; and
a plurality of digital logic gates, including a first digital logic gate and a second digital logic gate, configured to execute a logic operation on an output of a respective shifter based on the respective bit value, the first digital logic gate connected to an output of the first shifter and configured to output a first decoded weight, the second digital logic gate connected to an output of the second shifter and configured to output a second decoded weight.

2. The neural network circuit of claim 1, wherein, in response to a bit value having a first bit value, the first shifter is configured to shift the set of non-zero-value weight words, wherein, in response to the bit value having a second bit value, the first shifter is configured to not shift the set of non-zero-value weight words.

3. The neural network circuit of claim 1, wherein the weight decoder is configured to decode the encoded weights within a single clock cycle.

4. The neural network circuit of claim 1, wherein the weight decoder is a first weight decoder configured to decode a first portion of the encoded weights, the neural network circuit further comprising:
a second weight decoder configured to decode a second portion of the encoded weights; and
a control logic circuit configured to control the first weight decoder and the second weight decoder.

5. The neural network circuit of claim 4, wherein the first weight decoder is configured to receive a signal, from the control logic circuit, indicating a number of available weight words stored in a weight word buffer, the first weight decoder configured to determine a number of bits having a first bit value in the index weight word, and decode the first portion of the encoded weights in response to the number of available weight words stored in the weight word buffer being equal to or greater than the number of bits having the first bit value.

6. A device comprising:
a neural network configured to receive a set of inputs and generate a set of outputs;
a weight memory configured to store encoded weights for the neural network, the encoded weights including an index weight word and a set of non-zero-value weight words; and
an accelerator configured to execute the neural network, the accelerator including:
a weight decoder including:
an index word decoder configured to receive the index weight word and generate control signals based on bit values of the index weight word;
a first plurality of shifters, including a first shifter and a second shifter, connected to the index word decoder and configured to receive the set of non-zero-value weight words and to execute a shift operation on the set of non-zero-value weight words based on a respective control signal, a number of the first plurality of shifters corresponding to a number of non-zero-value weight words in the set; and
a plurality of digital logic gates, including a first digital logic gate and a second digital logic gate, coupled to an output of the first plurality of shifters and the index word decoder, and configured to execute a logic operation on an output of a respective shifter based on a respective control signal, the plurality of digital logic gates configured to generate decoded weights having one or more zero-value weight words within the set of non-zero-value weight words, the first digital logic gate connected to an output of the first shifter and configured to output a first decoded weight, the second digital logic gate connected to an output of the second shifter and configured to output a second decoded weight; and
a second plurality of shifters configured to align the decoded weights with a plurality of input-weight multipliers.

7. The device of claim 6, wherein the weight decoder is a first weight decoder configured to decode a first portion of the encoded weights, the index weight word being a first index weight word, the accelerator further including:
a weight word buffer configured to temporarily store the encoded weights; and
a second weight decoder configured to decode a second portion of the encoded weights, at least partially, in parallel with the first weight decoder.

8. The device of claim 6, wherein each bit value in the index weight word has a first bit value or a second bit value, the first bit value indicating an inclusion of a zero-value weight word in the decoded weights, the second bit value indicating an inclusion of a non-zero-value weight word in the decoded weights.

9. A method of decoding weights of a neural network, the method comprising:
retrieving encoded weights from a weight memory via a processor data bus, the encoded weights including an index weight word and a set of non-zero-value weight words, the set of non-zero-value weight words being devoid of a zero-value weight word, the zero-value weight word having a plurality of bits greater or equal to four, the zero-value weight word having a zero-value for each bit of the plurality of bits;
decoding the encoded weights using the index weight word to generate decoded weights, the decoded weights having one or more zero-value weight words within the set of non-zero-value weight words, the decoding including:
generating, by an index word decoder, a control signal based on a respective bit value in the index weight word;
executing, by a first plurality of shifters, including a first shifter and a second shifter, connected to the index word decoder, a shift operation on the set of non-zero-value weight words according to the control signal, a number of the first plurality of shifters corresponding to a number of non-zero-value weight words in the set; and
executing, by a plurality of digital logic gates, including a first digital logic gate and a second digital logic gate, connected to the index word decoder and the first plurality of shifters, a logic operation on an output of a respective shifter based on the control signal, the first digital logic gate connected to an output of the first shifter and configured to output a first decoded weight, the second digital logic gate connected to an output of the second shifter and configured to output a second decoded weight; and providing, using a second plurality of shifters, the decoded weights to a plurality of input-weight multipliers.

10. The method of claim 9, wherein each bit value in the index weight word has a first bit value or a second bit value, the first bit value indicating an inclusion of a zero-value weight word in the decoded weights, the second bit value indicating an inclusion of a non-zero-value weight word in the decoded weights.

11. The neural network circuit of claim 1, wherein the plurality of shifters is a first plurality of shifters, the neural network circuit further comprising:

a second plurality of shifters connected to the plurality of digital logic gates, wherein the second plurality of shifters are configured to align the decoded weights with the plurality of input-weight multipliers.

12. The device of claim 6, wherein the set of inputs includes speech data, the set of outputs including one or more potential speech commands that correspond to the speech data.

13. The device of claim 6, wherein each of the first plurality of shifters is configured to receive the set of non-zero-value weight words.

14. The device of claim 6, wherein the first digital logic gate includes an AND gate.

15. The neural network circuit of claim 1, wherein each of the non-zero-value weight words in the set has a same number of bits that is greater than or equal to four, the index weight word having a number of bits that correspond to a number of the non-zero-value weight words in the set.

16. The neural network circuit of claim 1, wherein the plurality of shifters is connected in parallel, the plurality of digital logic gates including a plurality of AND gates, each of the plurality of AND gates is connected to an output of a respective shifter of the plurality of shifters.

17. The neural network circuit of claim 1, wherein the index weight word includes eight or more bits.

18. The neural network circuit of claim 1, wherein a zero-value weight word has a zero-value for each bit, and a non-zero-value weight word has a non-zero-value for at least one bit, the set of non-zero-value weight words being devoid of any zero-value weight words.

\* \* \* \* \*